United States Patent
Han et al.

(10) Patent No.: US 11,380,779 B2
(45) Date of Patent: Jul. 5, 2022

(54) SEMICONDUCTOR DEVICE AND MANUFACTURING METHOD THEREOF

(71) Applicants: TAIWAN SEMICONDUCTOR MANUFACTURING CO., LTD., Hsinchu (TW); TSMC CHINA COMPANY LIMITED, Shanghai (CN)

(72) Inventors: Feng Han, Shanghai (CN); Lei Shi, Shanghai (CN); Hung-Chih Tsai, Kaohsiung County (TW); Liang-Yu Su, Yunlin County (TW); Hang Fan, Shanghai (CN)

(73) Assignees: TAIWAN SEMICONDUCTOR MANUFACTURING CO., LTD., Hsinchu (TW); TSMC CHINA COMPANY LIMITED, Shanghai (CN)

( * ) Notice: Subject to any disclaimer, the term of this patent is extended or adjusted under 35 U.S.C. 154(b) by 0 days.

(21) Appl. No.: 17/060,049

(22) Filed: Sep. 30, 2020

(65) Prior Publication Data
US 2022/0069107 A1 Mar. 3, 2022

(30) Foreign Application Priority Data
Aug. 31, 2020 (CN) .......................... 202010894515.6

(51) Int. Cl.
*H01L 29/76* (2006.01)
*H01L 29/94* (2006.01)
(Continued)

(52) U.S. Cl.
CPC .................. *H01L 29/66681* (2013.01); *H01L 21/823412* (2013.01); *H01L 29/0649* (2013.01); *H01L 29/7816* (2013.01)

(58) Field of Classification Search
CPC ............ H01L 29/7816; H01L 29/0653; H01L 29/66681; H01L 29/7833; H01L 29/6659;
(Continued)

(56) References Cited

U.S. PATENT DOCUMENTS 6,049,114 A * 4/2000 Maiti .............. H01L 21/823842
257/412
7,169,676 B1 * 1/2007 Zhong ............... H01L 21/26586
257/E21.165
(Continued)

FOREIGN PATENT DOCUMENTS

KR 1020040008631 A 1/2004
KR 1020150125747 A 11/2015
(Continued)

*Primary Examiner* — Theresa T Doan
(74) *Attorney, Agent, or Firm* — Maschoff Brennan

(57) ABSTRACT

A semiconductor device includes a gate structure, a double diffused region, a source region, a drain region, a first gate spacer, and a second gate spacer. The gate structure is over a semiconductor substrate. The double diffused region is in the semiconductor substrate and laterally extends past a first side of gate structure. The source region is in the semiconductor substrate and is adjacent a second side of the gate structure opposite the first side. The drain region is in the double diffused region in the semiconductor substrate and is of a same conductivity type as the double diffused region. The first gate spacer is on the first side of the gate structure. The second gate spacer extends upwardly from the double diffused region along an outermost sidewall of the first gate spacer and terminates prior to reaching a top surface of the gate structure.

20 Claims, 30 Drawing Sheets

(51) Int. Cl.

| | | |
|---|---|---|
| *H01L 31/062* | (2012.01) | |
| *H01L 29/66* | (2006.01) | |
| *H01L 29/06* | (2006.01) | |
| *H01L 21/8234* | (2006.01) | |
| *H01L 29/78* | (2006.01) | |

(58) Field of Classification Search
CPC ..... H01L 21/823418; H01L 21/823814; H01L 29/6656; H01L 29/66636
USPC .......................................................... 257/336
See application file for complete search history.

(56) References Cited

U.S. PATENT DOCUMENTS

| | | | |
|---|---|---|---|
| 2003/0025135 A1* | 2/2003 | Matsumoto | H01L 21/84 257/288 |
| 2008/0102573 A1* | 5/2008 | Liang | H01L 29/66636 438/231 |
| 2015/0318293 A1 | 11/2015 | Lee et al. | |
| 2017/0278963 A1 | 9/2017 | Liu et al. | |

FOREIGN PATENT DOCUMENTS

| | | | |
|---|---|---|---|
| TW | 200518336 A | 6/2005 | |
| TW | 200534482 A | 10/2005 | |
| TW | 200719413 A | 5/2007 | |
| TW | 201432907 A | 8/2014 | |
| TW | 201801154 A | 1/2018 | |

* cited by examiner

SEMICONDUCTOR DEVICE AND MANUFACTURING METHOD THEREOF

PRIORITY CLAIM AND CROSS-REFERENCE

The present application claims priority to China Application Serial Number 202010894515.6, filed Aug. 31, 2020, which is herein incorporated by reference.

BACKGROUND

The semiconductor industry has experienced rapid growth due to improvements in the integration density of a variety of electronic components (e.g., transistors, diodes, resistors, capacitors, etc.). For the most part, this improvement in integration density has come from shrinking the semiconductor process node (e.g., shrink the process node towards the sub-20 nm node). As semiconductor devices are scaled down, new techniques are desired to maintain the electronic components' performance from one generation to the next. For example, low on-resistance and high breakdown voltage of transistors are desirable for various high power applications.

As semiconductor technologies evolve, metal oxide semiconductor field effect transistors (MOSFET) have been widely used in today's integrated circuits. MOSFETs are voltage controlled devices. When a control voltage is applied to the gate of a MOSFET and the control voltage is greater than the threshold of the MOSFET, a conductive channel is established between the drain and the source of the MOSFET. As a result, a current flows between the drain and the source of the MOSFET. On the other hand, when the control voltage is less than the threshold of the MOSFET, the MOSFET is turned off accordingly.

According to the conductivity type difference, MOSFETs may include two major categories. One is n-channel MOSFETs; the other is p-channel MOSFETs. On the other hand, according to the structure difference, MOSFETs can be further divided into three sub-categories, planar MOSFETs, lateral diffused MOS (LDMOS) FETs and vertical diffused MOSFETs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
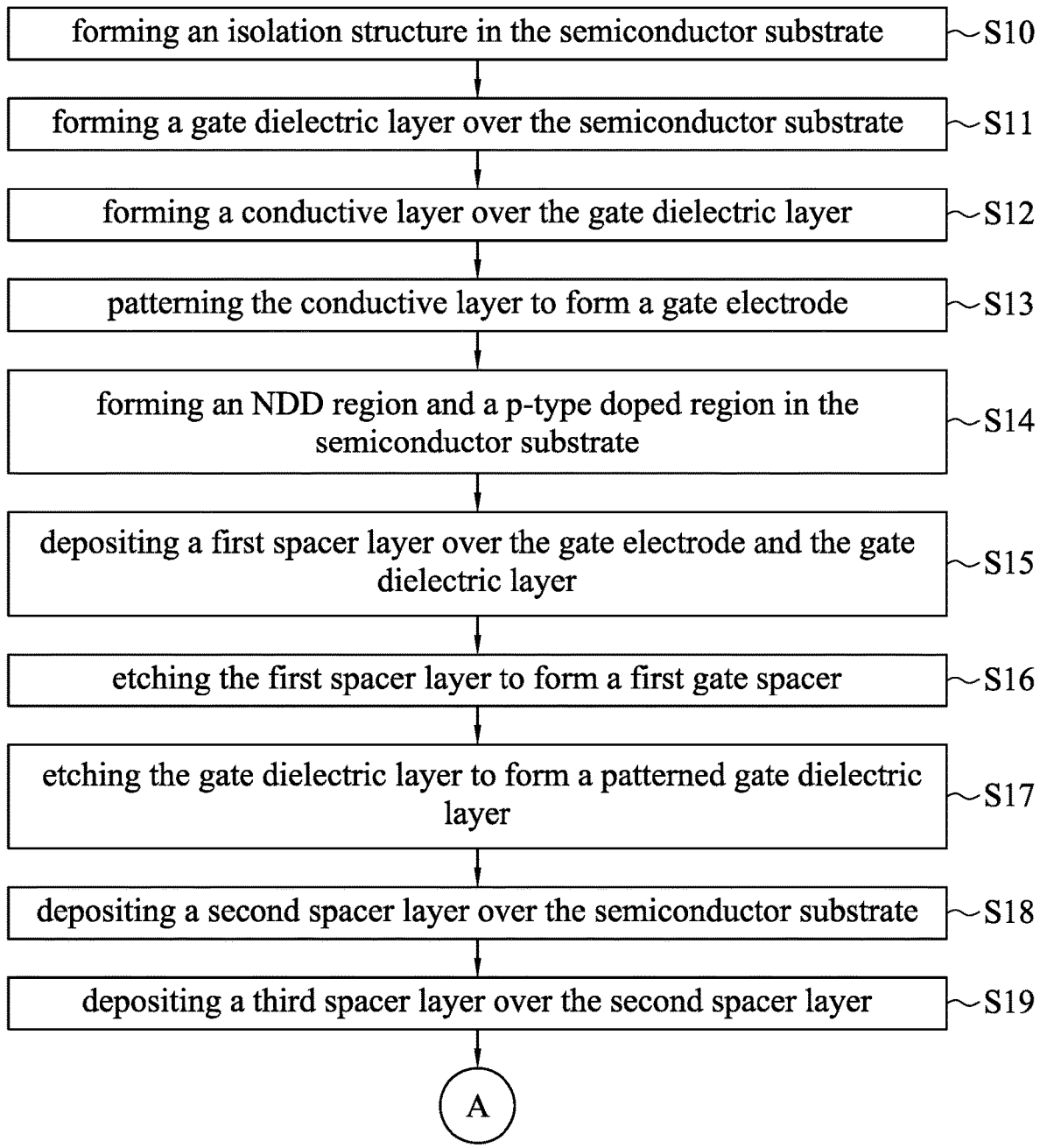
FIGS. 1A and 1B illustrate a block diagram of a method of forming a semiconductor device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, "around", "about", "approximately", or "substantially" shall generally mean within 20 percent, or within 10 percent, or within 5 percent of a given value or range. Numerical quantities given herein are approximate, meaning that the term "around", "about", "approximately", or "substantially" can be inferred if not expressly stated.

The lateral diffused (LD) MOS transistor has advantages. For example, the LDMOS transistor is capable of delivering more current per unit area because its asymmetric structure provides a short channel between the drain and the source of the LDMOS transistor. However, it has been appreciated that the LDMOS transistor suffers some issues as described below. The LDMOS transistor formed with field oxide (FOX) would result in an excessively large device size and an excessive high specific on-resistance ($R_{sp}$) because a large FOX structure is present between the source region and the drain region of the LDMOS transistor. On the other hand, if the LDMOS transistor is formed without FOX, a non-self-aligned implant is employed to form source/drain regions of the LDMOS transistor, and a resist protect layer (RPO) is employed to define a desired silicide region within the drain region of the LDMOS transistor. However, the non-self-aligned implant may result in un-doped region in a poly gate of the LDMOS transistor because the photolithography technique used in the non-self-aligned implant may suffer from misalignment, and the RPO may result in un-silicide region in the poly gate because the RPO may be formed over a top surface of the poly gate. In addition, the drift region of the LDMOS transistor may not be scaled down due to the RPO minimal length constraint.

The present disclosure will be described with respect to embodiments in a specific context, a LDMOS transistor manufactured using an improved process flow to address the foregoing issues resulting from the FOX and RPO. The embodiments of the disclosure may also be applied, however, to a variety of metal oxide semiconductor transistors. Hereinafter, various embodiments will be explained in detail with reference to the accompanying drawings.

Figure 1B:
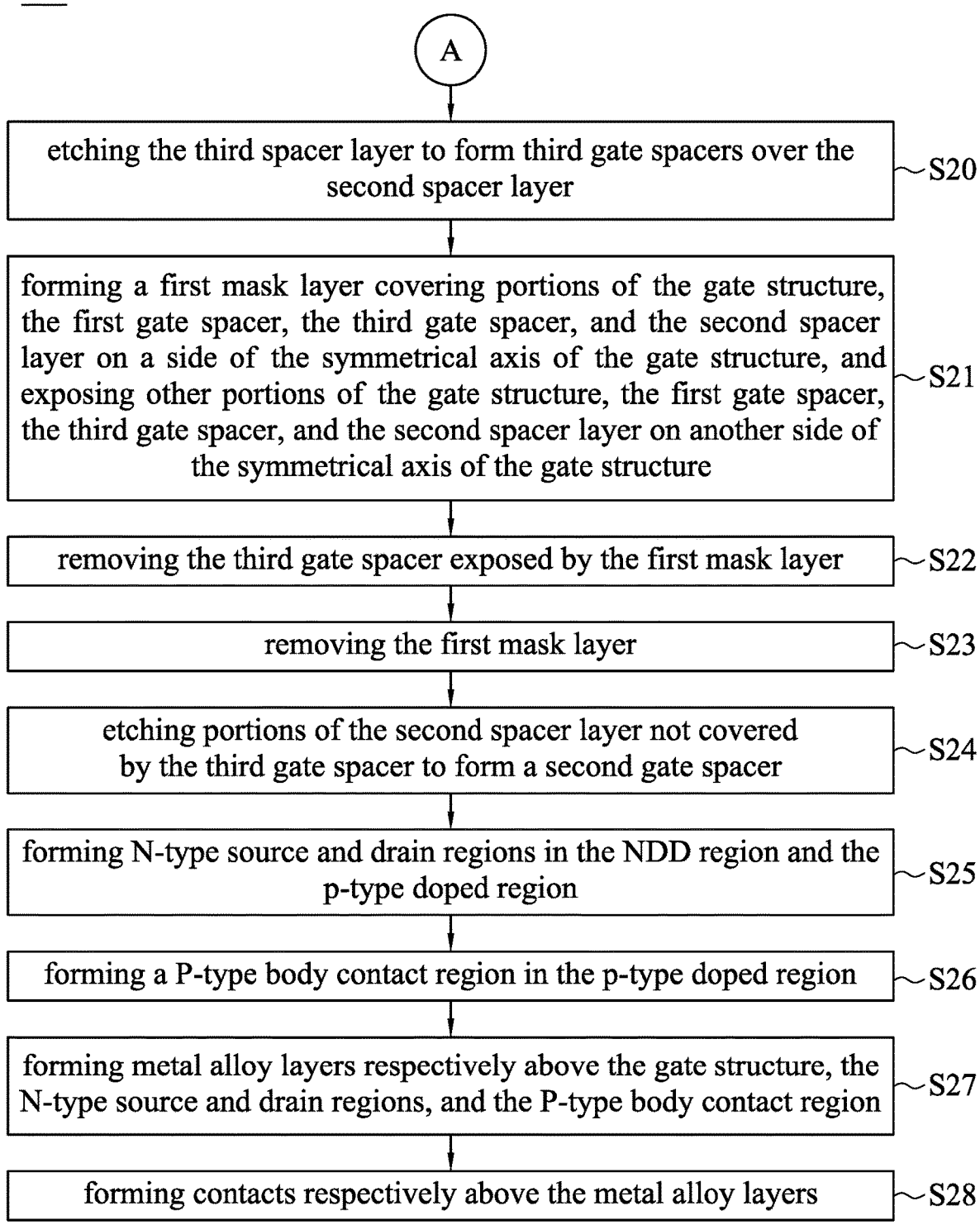

Referring now to FIGS. 1A and 1B, illustrated is an exemplary method M1 for fabrication of a semiconductor device in accordance with some embodiments, in which the fabrication includes a self-aligned implantation process of fabricating a semiconductor device. The method M1 includes a relevant part of the entire manufacturing process. It is understood that additional operations may be provided before, during, and after the operations shown by FIGS. 1A and 1B, and some of the operations described below can be replaced or eliminated for additional embodiments of the method. The order of the operations/processes may be interchangeable. The method M1 includes fabrication of a semiconductor device 100. However, the fabrication of the semiconductor device 100 is merely example for describing the self-aligned implantation process used in fabricating the semiconductor device 100 according to some embodiments of the present disclosure.

It is noted that FIGS. 1A and 1B have been simplified for a better understanding of the disclosed embodiment. Moreover, the semiconductor device 100 may be configured as a system-on-chip (SoC) device having various PMOS and NMOS transistors that are fabricated to operate at different voltage levels. The PMOS and NMOS transistors may provide low voltage functionality including logic/memory devices and input/output devices, and high voltage functionality including power management devices. For example, transistors that provide low voltage functionality may have operating (or drain) voltages of about 1.1 V with standard CMOS technology, or voltages of about 1.8/2.5/3.3 V with special (input/output) transistors in standard CMOS technology. In addition, transistors that provide medium/high voltage functionality may have operating (or drain) voltages of about 5 V or greater (e.g., about 20-35 V). It is understood that the semiconductor device 100 in FIGS. 2-21 may also include resistors, capacitors, inductors, diodes, and other suitable microelectronic devices that may be implemented in integrated circuits.

Figure 2:
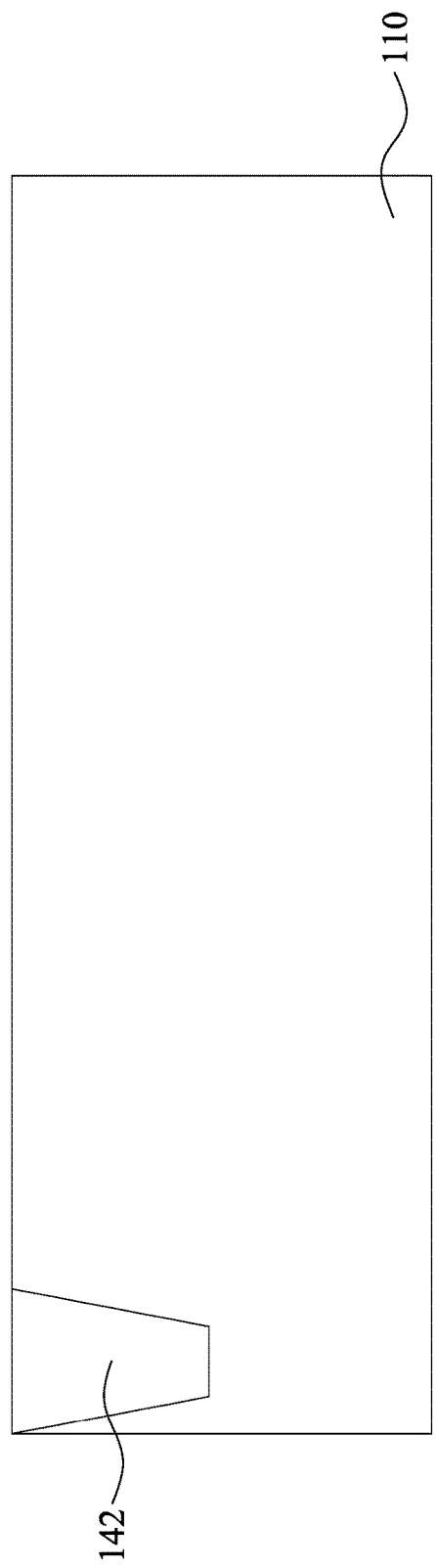
FIGS. 2 to 20 illustrate a method for manufacturing a semiconductor device in different stages in accordance with some embodiments.

FIGS. 2 to 20 illustrate a method for manufacturing the semiconductor device 100 in different stages in accordance with some embodiments. The method M1 begins at block S10 where an isolation structure 142 is formed in a semiconductor substrate 110, as illustrated in FIG. 2. The semiconductor substrate 110 may include a semiconductor wafer such as a silicon wafer. Alternatively, the semiconductor substrate 110 may include other elementary semiconductors such as germanium. The semiconductor substrate 110 may also include a compound semiconductor such as silicon carbide, gallium arsenic, indium arsenide, indium phosphide, or other suitable materials. Moreover, the semiconductor substrate 110 may include an alloy semiconductor such as silicon germanium, silicon germanium carbide, gallium arsenic phosphide, and gallium indium phosphide, or other suitable materials. In some embodiments, the semiconductor substrate 110 includes an epitaxial layer (epi layer) overlying a bulk semiconductor. Furthermore, the semiconductor substrate 110 may include a semiconductor-on-insulator (SOI) structure. For example, the semiconductor substrate 110 may include a buried oxide (BOX) layer formed by a process such as separation by implanted oxygen (SIMOX). In various embodiments, the semiconductor substrate 110 may include a buried layer such as an n-type buried layer (NBL), a p-type buried layer (PBL), and/or a buried dielectric layer including a buried oxide (BOX) layer. In the some embodiments, illustrated as an n-type MOS, the semiconductor substrate 110 includes a p-type silicon substrate (p-substrate). For example, p-type impurities (e.g., boron) are doped into the semiconductor substrate 110 to form the p-substrate. To form a complementary MOS, an n-type buried layer, i.e., deep n-well (DNW), may be implanted deeply under the active region of the p-substrate 110. In some embodiments, arsenic or phosphorus ions are implanted to form the DNW. In some other embodiments, the DNW is formed by selective diffusion. The DNW functions to electrically isolate the p-substrate.

In FIG. 2, an isolation structure 142 such as shallow trench isolation (STI) or local oxidation of silicon (LOCOS) (or field oxide, FOX) including isolation regions may be formed in the semiconductor substrate 110 to define and electrically isolate various active regions so as to prevent leakage current from flowing between adjacent active regions. As one example, the formation of an STI feature may include dry etching a trench in a substrate and filling the trench with insulator materials such as silicon oxide, silicon nitride, silicon oxynitride, or other suitable materials. The filled trench may have a multi-layer structure such as a thermal oxide liner layer filled with silicon nitride or silicon oxide. In some other embodiments, the STI structure may be created using a processing sequence such as: growing a pad oxide, forming a low pressure chemical vapor deposition (LPCVD) nitride layer, patterning an STI opening using photoresist and masking, etching a trench in the substrate, optionally growing a thermal oxide trench liner to improve the trench interface, filling the trench with CVD oxide, using chemical mechanical polishing (CMP) processing to planarize the CVD oxide, and using a nitride stripping process to remove the silicon nitride. In some embodiments where the flowable CVD is used in forming the CVD oxide of the STI region 142, an anneal process can be performed to cure the deposited oxide.

Figure 3:
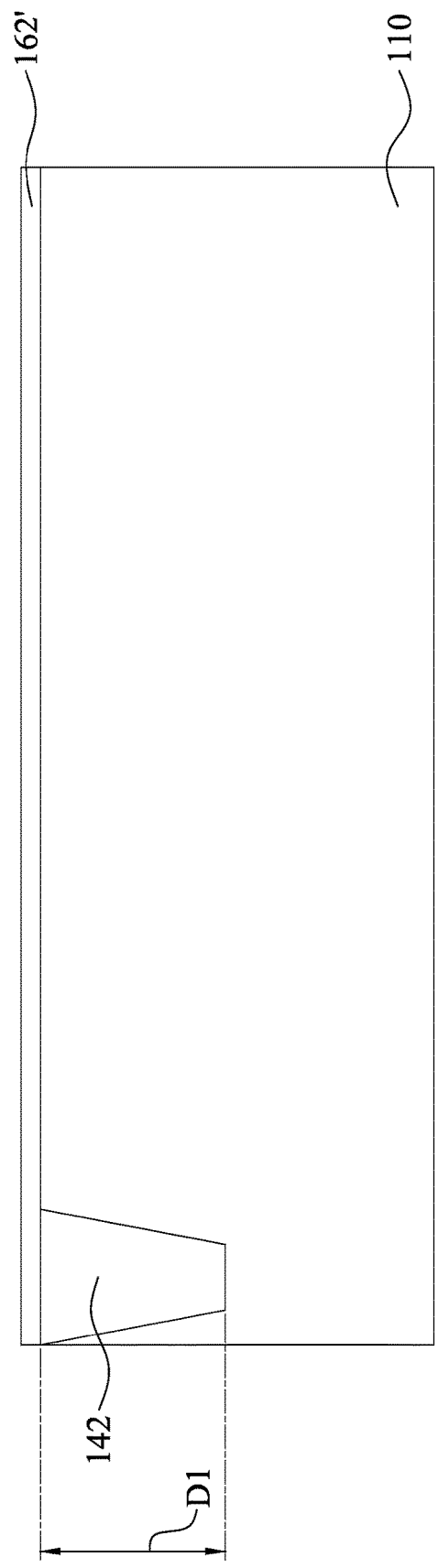

Returning to FIG. 1A, the method M1 then proceeds to block S11 where a gate dielectric layer is formed over the semiconductor substrate. With reference to FIG. 3, in some embodiments of block S11, a gate dielectric layer 162' is formed over the semiconductor substrate 110. The gate dielectric layer 162' may include a silicon oxide layer. Alternatively, the gate dielectric layer 162' may include a high-k dielectric material. The high-k material may be selected from metal oxides, metal nitrides, metal silicates, transition metal-oxides, transition metal-nitrides, transition metal-silicates, oxy-nitrides of metals, metal aluminates, zirconium silicate, zirconium aluminate, hafnium oxide, other suitable materials or combinations thereof. Alternatively, the gate dielectric layer 162' may include oxide and/or nitride material. For example, the gate dielectric layer 162' may include silicon oxide, silicon nitride, silicon oxynitride, SiCN, SiCxOyNz, other suitable materials, or combinations thereof. For example, the gate dielectric layer 162' may include silicon oxide. In some embodiments, the gate dielectric layer 162' may have a multilayer structure such as one layer of silicon oxide and another layer of high k material. The gate dielectric layer 162' may be formed using chemical vapor deposition (CVD), physical vapor deposition (PVD), atomic layer deposition (ALD), thermal oxidation, other suitable processes, or combinations thereof.

Figure 4:
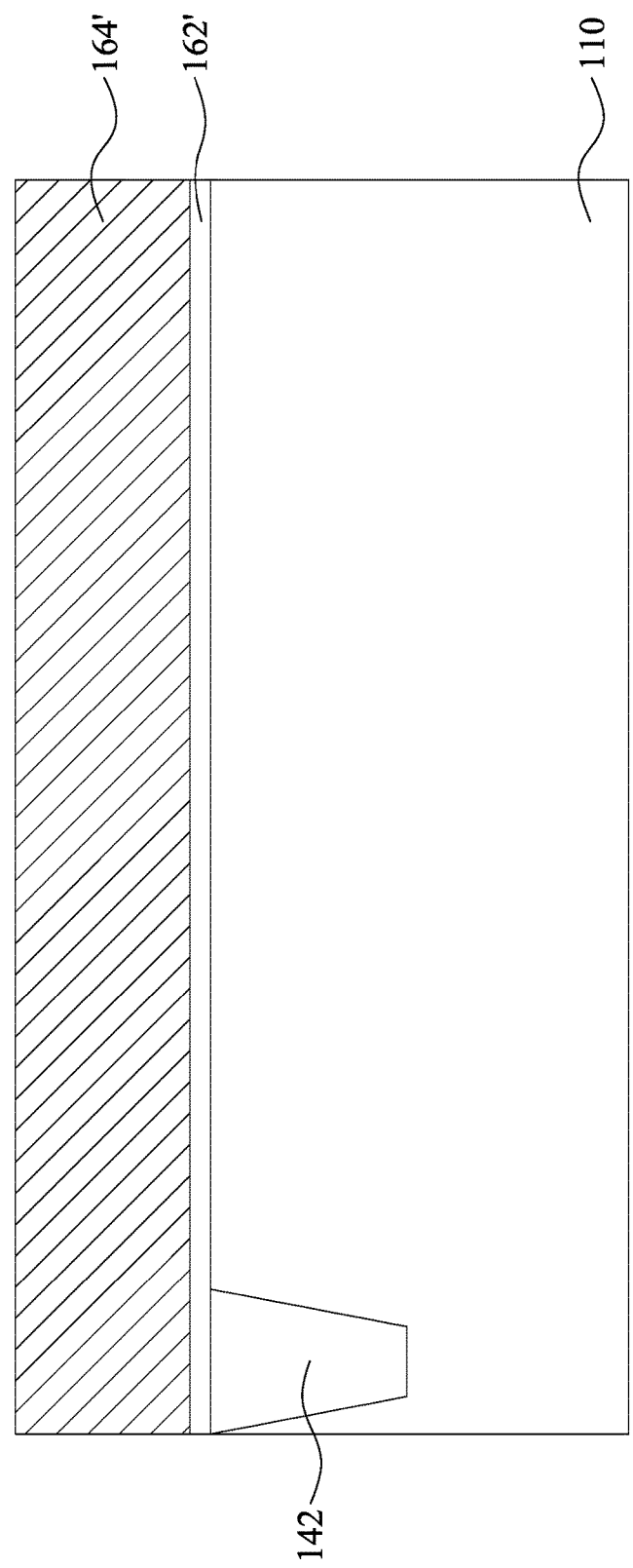

Returning to FIG. 1A, the method M1 then proceeds to block S12 where a conductive layer is formed over the gate dielectric layer. With reference to FIG. 4, in some embodiments of block S12, a conductive layer 164' is formed over the gate dielectric layer 162'. The conductive layer 164' may include polycrystalline silicon (interchangeably referred to as polysilicon). Alternatively, the conductive layer 164' may include a metal such as Al, Cu, W, Ti, Ta, TiN, TaN, NiSi, CoSi, other suitable conductive materials, or combinations thereof. The conductive layer 164' may be formed by CVD, PVD, plating, and other proper processes. The conductive layer 164' may have a multilayer structure and may be formed in a multi-step process using a combination of different processes.

Figure 5:
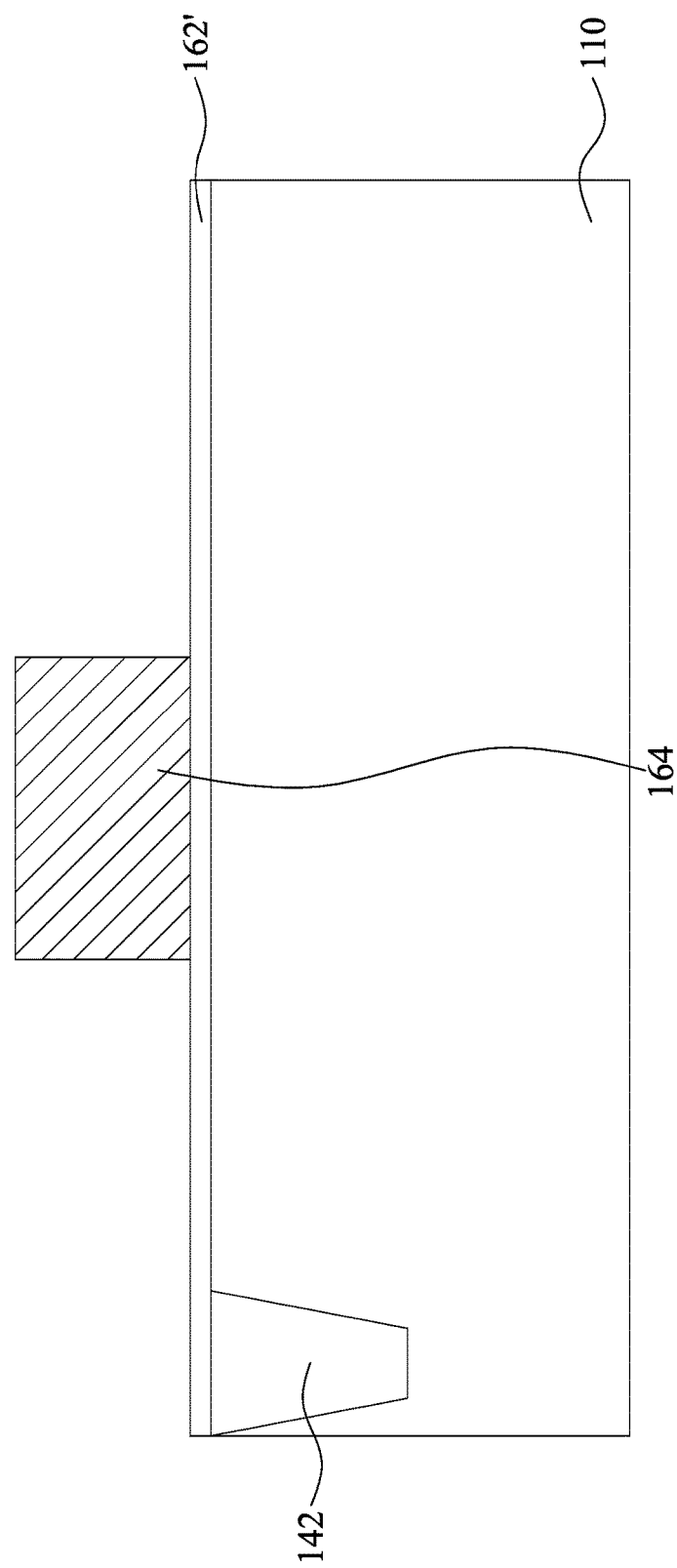

Returning to FIG. 1A, the method M1 then proceeds to block S13 where the conductive layer is patterned to form a gate electrode. With reference to FIG. 5, in some embodiments of block S13, the conductive layer 164' in FIG. 4 is patterned to form a gate electrode 164 on the gate dielectric layer 162'. In some embodiments, a patterned mask layer (not shown) is formed over the conductive layer 164' in FIG. 4. The patterned mask layer may be formed by a series of operations including deposition, photolithography patterning, and etching processes. The photolithography patterning processes may include photoresist coating (e.g., spin-on coating), soft baking, mask aligning, exposure, post-exposure baking, developing the photoresist, rinsing, drying (e.g., hard baking), and/or other applicable processes. The etching processes may include dry etching, wet etching, and/or other etching methods (e.g., reactive ion etching). Then, one or more etching processes are performed to form a gate electrode 164 on the gate dielectric layer 162' using the patterned mask as an etching mask, and the patterned mask layer is removed after the etching.

Figure 6:
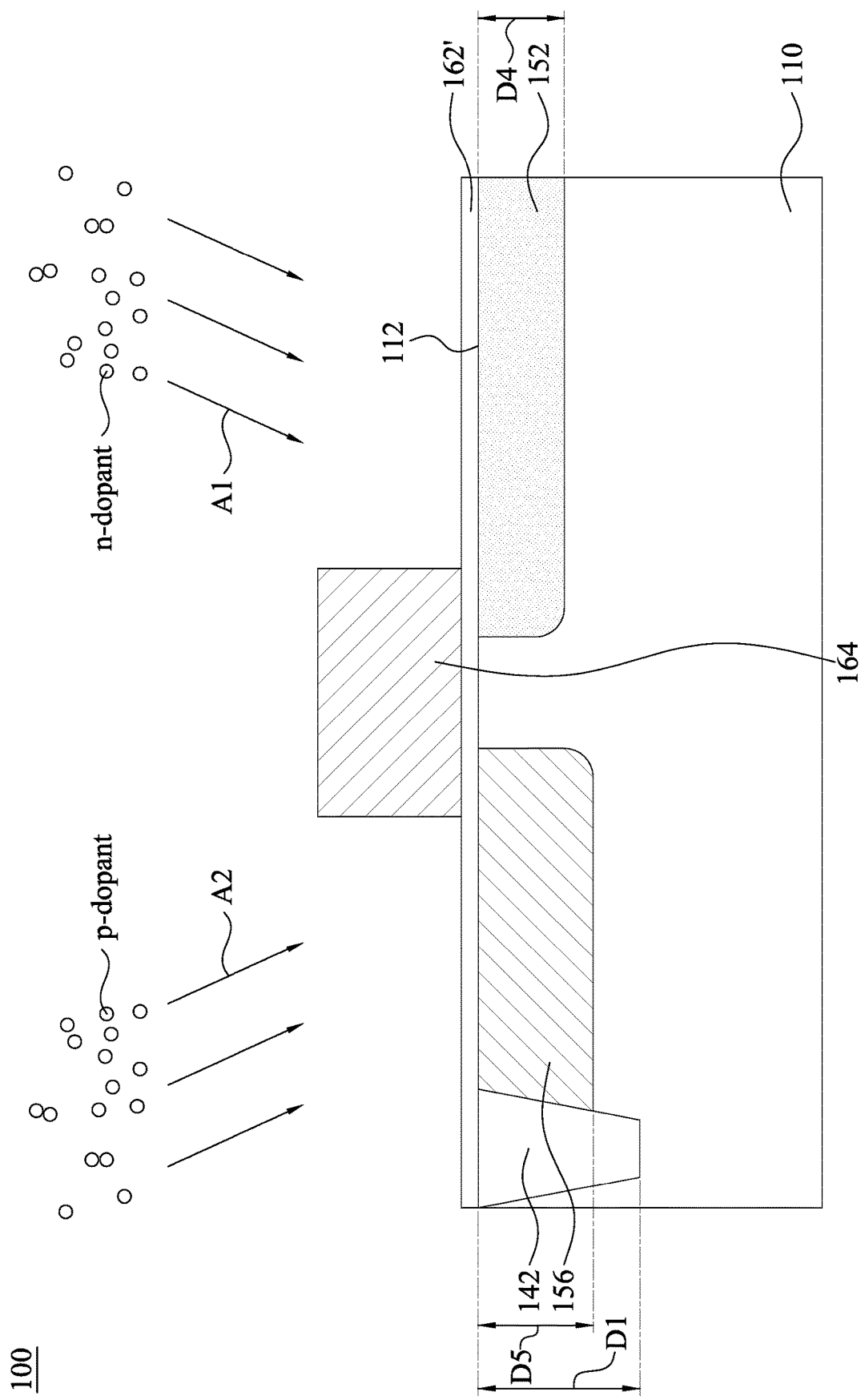
Figure 17:
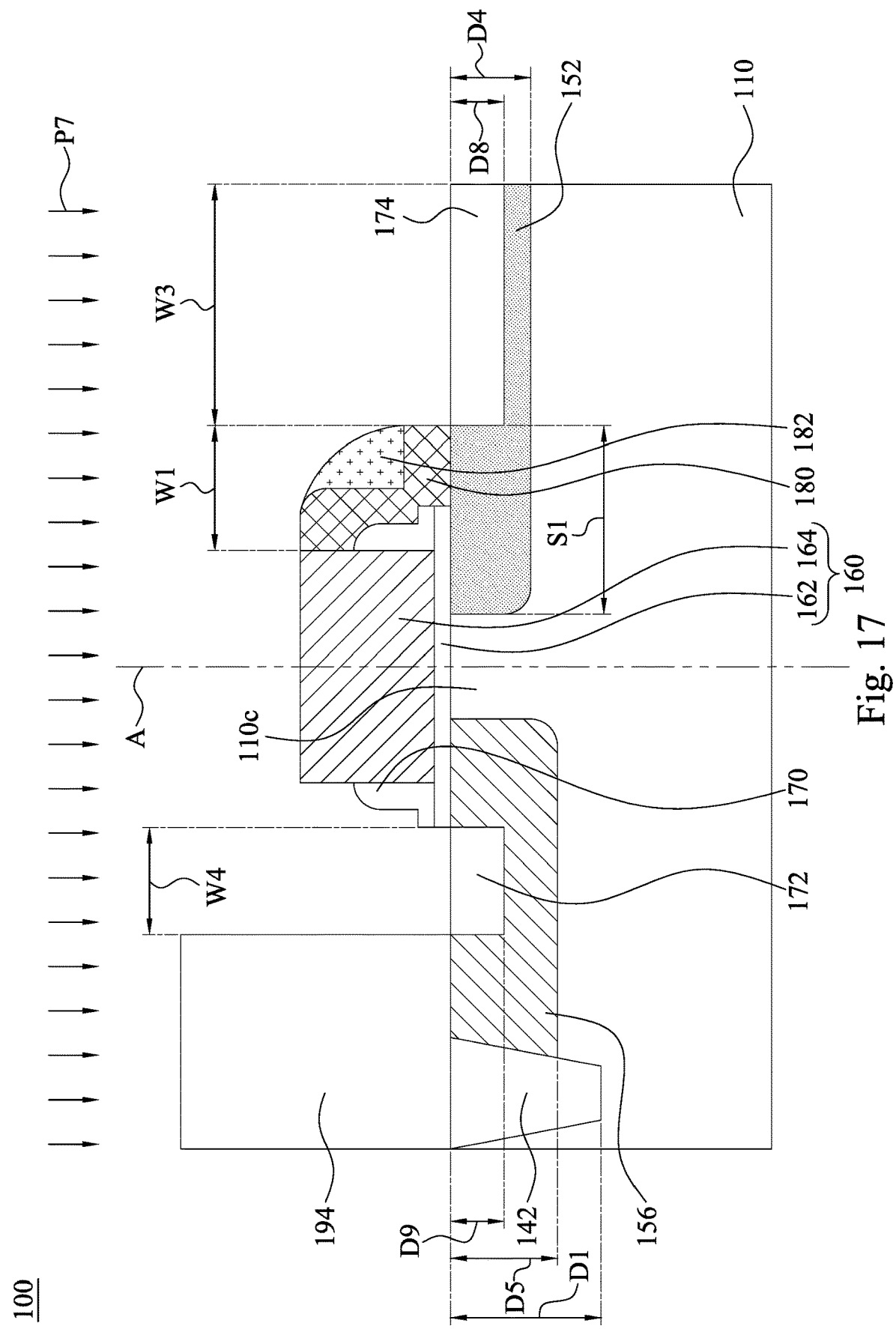

Returning to FIG. 1A, the method M1 then proceeds to block S14 where an n-type doped region and a p-type doped region are formed in the semiconductor substrate. With reference to FIG. 6, in some embodiments of block S14, an n-type double diffused (NDD) doped region 152 is formed in the semiconductor substrate 110 and in the vicinity of a top surface 112 of the semiconductor substrate 110. In this context, the "double diffused" doped region is a doped region that experiences dual implantation processes with dopants of same conductivity type during fabrication of the LDMOS transistor. For example, the region 152 is implanted with n-type dopant at the step as illustrated in FIG. 6, and then a part of the region 152 will be implanted with n-type dopant again at the step as illustrated in FIG. 17, and thus this region is referred to as a double diffused doped region (e.g., double diffused drain region in this embodiment). It is noted the double diffused doping profile will be formed at the step as illustrated in FIG. 17, not formed at the step as illustrated FIG. 6, and the terminology "double diffused region" recited at this step is merely used to distinguish from body region of LDMOS transistor.

In some embodiments, the NDD region 152 is formed by ion-implantation, diffusion techniques, or other suitable techniques. For example, an ion implantation utilizing an n-type dopant, such as arsenic or phosphorus, may be performed to form the NDD region 152 in the semiconductor substrate 110 through the gate dielectric layer 162' using a first patterned mask layer (e.g., first patterned photoresist mask) and a portion of the gate electrode 164 as an implant mask. In FIG. 6, the NDD region 152 has a portion under the gate electrode 164 because of the implantation tilt angle of the ion-implantation for forming the NDD region 152. For example, a first mask layer (e.g., patterned photoresist mask) is formed to cover a left portion of the gate electrode 164 and a region of the semiconductor substrate 110 in the vicinity of the left portion the gate electrode 164, while leaving a right portion of the gate electrode 164 and another region of the semiconductor substrate 110 in the vicinity of the right portion of the gate electrode 164 exposed. In some embodiments, the first mask layer may be formed by a photolithography process. The photolithography processes may include photoresist coating (e.g., spin-on coating), soft baking, mask aligning, exposure, post-exposure baking, developing the photoresist, rinsing, drying (e.g., hard baking), and/or other applicable processes. Then, an implantation process is performed to implant an n-type dopant at a tilt angle (as indicated by the arrows A1) using the first mask layer and the gate electrode 164 as an implant mask, thus forming the NDD region 152 in the semiconductor substrate 110 and extending to directly below the gate electrode 164 due to the tilt angle. The first mask layer is then removed after the forming of the NDD region 152. In some embodiments, the dopant concentration of the NDD region 152 is in a range, by way of example and not limitation, from about $10^{16}$ and about $10^{18}$ per cubic centimeter, and other dopant concentration ranges are within the scope of the disclosure. In some embodiments, the isolation structure 142 has a depth D1. In some embodiments, the NDD region 152 has a depth D4 less than the depth D1 of the isolation structures 142. By way of example and not limitation, a ratio of the depth D4 of the NDD region 152 to the depth D1 of the STI 142 is in a range from about 0.2 to about 1. In some other embodiments, the depth D4 of the NDD region 152 may be greater than the depth D1 of the isolation structure 142.

Then, a p-type doped region (interchangeably referred to as a p-body region) 156 is formed in the semiconductor substrate 110 and in the vicinity of the top surface 112 of the semiconductor substrate 110. Specifically, the p-body region 156 is formed between the NDD region 152 and the isolation structure 142. In some embodiments, the p-body region 156 is formed by ion-implantation, diffusion techniques, or other suitable techniques. For example, an ion implantation utilizing a p-type dopant, such as boron, may be performed to form the p-body region 156 in the semiconductor substrate 110 through the gate dielectric layer 162' using a second patterned mask layer (e.g., second patterned photoresist mask) and the left portion of the gate electrode 164 as an implant mask. In FIG. 6, the p-body region 156 has a portion under the gate electrode 164 because of the implantation tilt angle of the ion-implantation for forming the p-body region 156. For example, a second mask layer is formed to cover a right portion of the gate electrode 164 and the NDD region 152, while leaving a left portion of the gate electrode 164 and the region of the semiconductor substrate 110 in the vicinity of the left portion the gate electrode 164 exposed. In some embodiments, the second mask layer may be formed by a photolithography patterning process. The photolithography patterning processes may include photoresist coating (e.g., spin-on coating), soft baking, mask aligning, exposure, post-exposure baking, developing the photoresist, rinsing, drying (e.g., hard baking), and/or other applicable processes. Then, an implantation process is performed to implant a p-type dopant at a tilt angle (as indicated by the arrows A2) using the second mask layer and the gate electrode 164 as an implant mask, thus forming the p-body region 156 in the semiconductor substrate 110 and extending to directly below the gate electrode 164 due to the tilt angle. The second mask layer is then removed after the forming of the p-body region 156. An ion implantation utilizing a p-type dopant, such as boron and/or boron difloride ($BF_2$), may be performed to form the p-body region 156 in the semiconductor substrate 110. In some embodiments, the dopant concentration of each of the p-body region 156 may be between about $10^{17}$ and about $10^{19}$ per cubic centimeter, and other dopant concentration ranges are within the scope of the disclosure. In some embodiments, the dopant concentration of the p-body region 156 may be greater than the dopant concentration of the NDD region 152. Although the embodiments discussed above include forming the p-body region 156 after forming the NDD region 152, the p-body region 156 can be formed before forming the NDD region 152 in some other embodiments.

In some embodiments, the p-body region 156 has a depth D5 less than the depth D1 of the isolation structure 142 and greater than the depth D4 of the NDD region 152. In some other embodiments, the depth D5 of the p-body region 156 may be less than the depth D4 of the NDD region 152. In some other embodiments, the depth D5 of the p-body region 156 may be greater than the depth D1 of the isolation structure 142.

It is understood that order of the operations/processes shown by FIGS. 1A and 1B may be interchangeable. In some embodiments, the NDD region 152 may be formed prior to forming the gate dielectric layer 162' and after forming the isolation structure 142. For example, the NDD region 152 is formed by ion-implantation, diffusion techniques, or other suitable techniques through a patterned photoresist layer. A photoresist layer is coated on the semiconductor substrate 110, and a photomask is then used to pattern the coated photoresist layer in a photolithography process or other suitable process. An exemplary photolithography process may include processing steps of photoresist coating, soft baking, mask aligning, exposing, post-exposure baking, developing, and hard baking. The patterned photoresist layer exposes a region of the semiconductor substrate 110. Thereafter, an ion implantation utilizing an n-type dopant, such as arsenic or phosphorus, may be performed to form the NDD region 152 in the semiconductor substrate 110 using the patterned photoresist layer as an implant mask.

In some embodiments, the p-body region 156 is formed prior to forming the gate dielectric layer 162' and after forming the isolation structure 142. For example, the p-body region 156 may be formed by ion-implantation, diffusion techniques, or other suitable techniques through a patterned photoresist layer. The photoresist layer used to define the NDD region 152 is stripped by ashing, and then another photoresist layer is coated on the semiconductor substrate 110. Next, another photomask with the pattern of the p-body region 156 is used to pattern the photoresist layer in a photolithography process or other suitable process. An exemplary photolithography process may include processing steps of photoresist coating, soft baking, mask aligning, exposing, post-exposure baking, developing, and hard baking.

Figure 7:
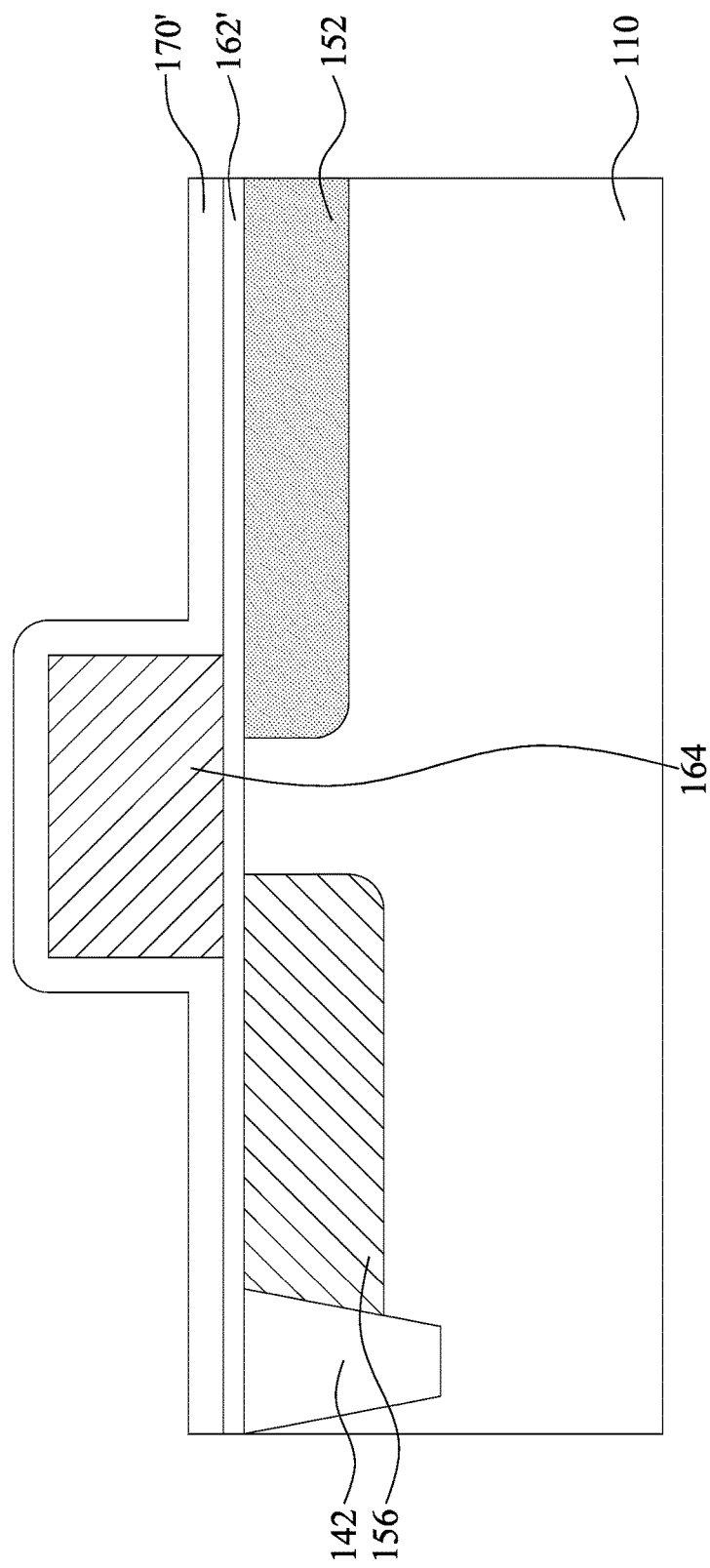

Returning to FIG. 1A, the method M1 then proceeds to block S15 where a first spacer layer is deposited over the gate electrode and the gate dielectric layer. With reference to FIG. 7, in some embodiments of block S15, a first spacer layer 170' is blanket deposited over the structure in FIG. 6 (i.e., over the NDD region 152, the p-body region 156, the gate dielectric layer 162', the gate electrode 164, and the isolation features 142). In some embodiments, the first spacer layer 170' may include silicon oxide, silicon nitride, silicon oxynitride, SiCN, $SiC_xO_yN_z$, other suitable materials, or combinations thereof. For example, the first spacer layer 170' may be a dielectric material such as silicon nitride. In some embodiments, the first spacer layer 170' includes a material different than the gate dielectric layer 162'. In some embodiments, the first spacer layer 170' may have a multi-layer structure. The first spacer layer 170' can be formed using a deposition method, such as plasma enhanced chemical vapor deposition (PECVD), low-pressure chemical vapor deposition (LPCVD), sub-atmospheric chemical vapor deposition (SACVD), or the like.

Figure 8:
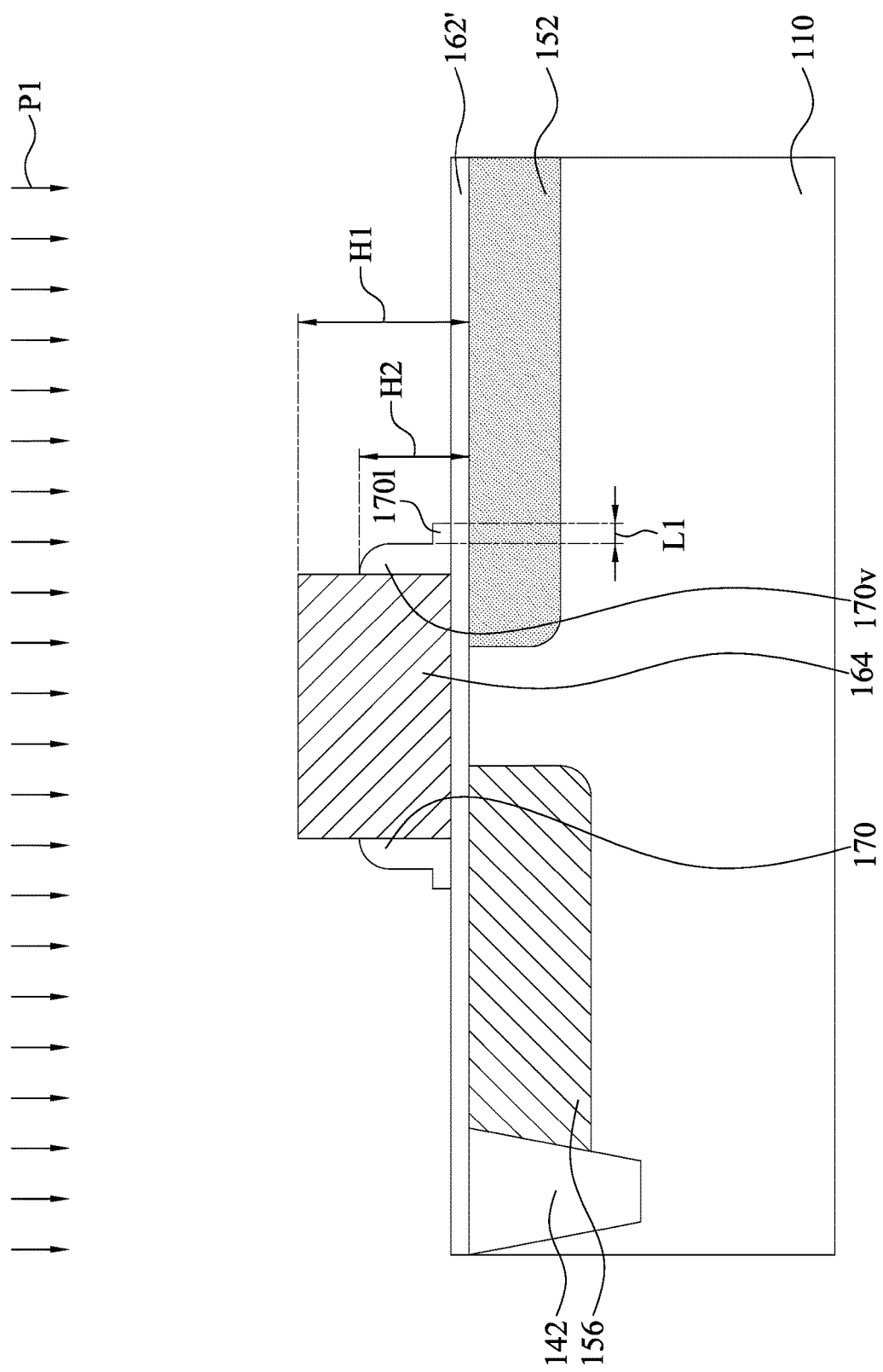

Returning to FIG. 1A, the method M1 then proceeds to block S16 where the first spacer layer is etched to form a first gate spacer. With reference to FIG. 8, in some embodiments of block S16, first gate spacers 170 are formed on opposite sides of the gate electrode 164. In greater detail, an anisotropic etching process P1 is performed to remove the horizontal portions of the first spacer layer 170'. The remaining vertical portions of the first spacer layer 170' form first gate spacers 170. The first gate spacers 170 have a height H2 measured from the top surface of the semiconductor substrate 110, and the gate electrode 164 has a height H1 measured from the top surface of the semiconductor substrate 110. In some embodiments, the height H2 of the first gate spacers 170 may be lower than the height H1 of the gate electrode 164 due to the nature of the anisotropic etching process that selectively etches the material of first gate spacers 170 at a faster etch rate than it etches the polysilicon gate 164. The height H2 of the first gate spacers 170 depends on process conditions of the anisotropic etching process P1 (e.g., etching time duration and/or the like). Moreover, the first gate spacers 170 each have a vertical portion 170v vertically extending along the vertical sidewall of the gate electrode 164 and a lateral portion 170l laterally extending a small length L1 from an outermost sidewall of the vertical portion 170v. The length L1 of the lateral portion 170l also depends on the process conditions of the anisotropic etching process P1 (e.g., etching time duration or the like). In some embodiments, the etching process is performed using an isotropic etching process. In some embodiments, the first spacer layer 170' is etched using, by way of example and not limitation, phosphoric acid ($H_3PO_4$).

Figure 9:
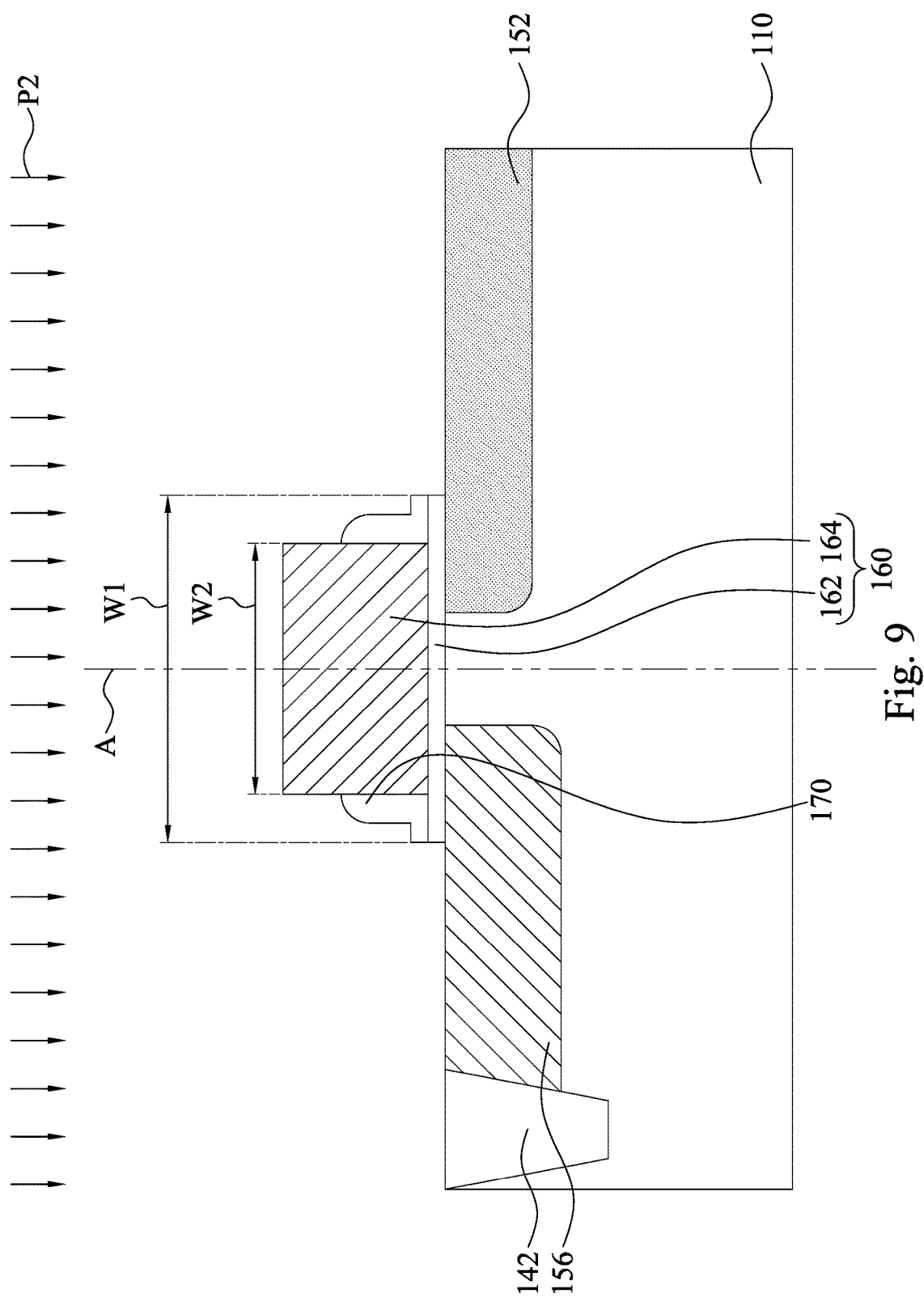

Returning to FIG. 1A, the method M1 then proceeds to block S17 where the blanket gate dielectric layer is etched to form a patterned gate dielectric layer. With reference to FIG. 9, in some embodiments of block S17, the blanket gate dielectric layer 162' as shown in FIG. 8 is patterned to form a gate dielectric layer 162 remaining below the gate electrode 164 and the first gate spacers 170. In greater detail, another etching process P2 is performed to pattern the gate dielectric layer 162 using the gate electrode 164 and the gate spacers 170 as an etching mask. By way of example and not limitation, the gate dielectric layer 162 can be patterned using a liquid hydrogen fluoride (HF) or vapor HF as an etchant, in some cases where the gate dielectric layer 162 is silicon oxide. The gate dielectric layer 162 and the gate electrode 164 in combination serve as a gate structure 160 with a vertical symmetrical axis A. As illustrated in FIG. 9, the gate structure 160 overlies portions of the NDD region 152 and the p-body region 156.

Figure 10:
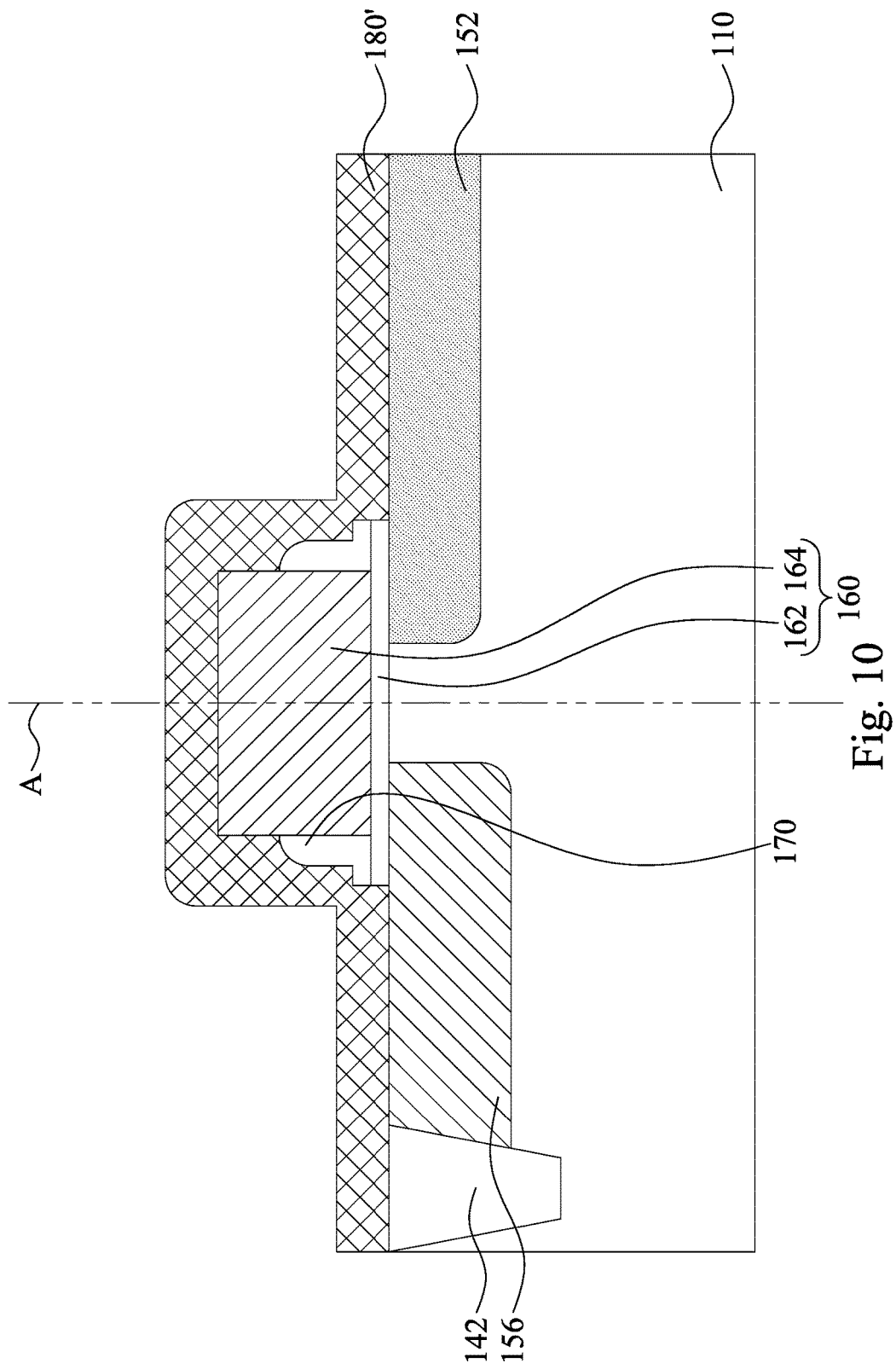

Returning to FIG. 1A, the method M1 then proceeds to block S18 where a second spacer layer is deposited over the semiconductor substrate. With reference to FIG. 10, in some embodiments of block S18, a second spacer layer 180' is blanket deposited over the structure as shown in FIG. 9 (i.e., over the NDD region 152, the p-body region 156, the gate dielectric layer 162, the gate electrode 164, first gate spacers 170, and the STI region 142). In some embodiments, the second spacer layer 180' may include silicon oxide, silicon nitride, silicon oxynitride, SiCN, $SiC_xO_yN_z$, other suitable materials, or combinations thereof. For example, the second spacer layer 180' may be a dielectric material such as silicon oxide. In some embodiments, the second spacer layer 180' may include a material different than the first gate spacers 170. In some embodiments, a material of the second spacer layer 180' may be the same as a material of the gate dielectric layer 162 (e.g., silicon oxide). In some embodiments, the second spacer layer 180' may have a multilayer structure. The second spacer layer 180' can be formed using a deposition method, such as plasma enhanced chemical vapor deposition (PECVD), low-pressure chemical vapor deposition (LPCVD), sub-atmospheric chemical vapor deposition (SACVD), or the like.

Figure 11:
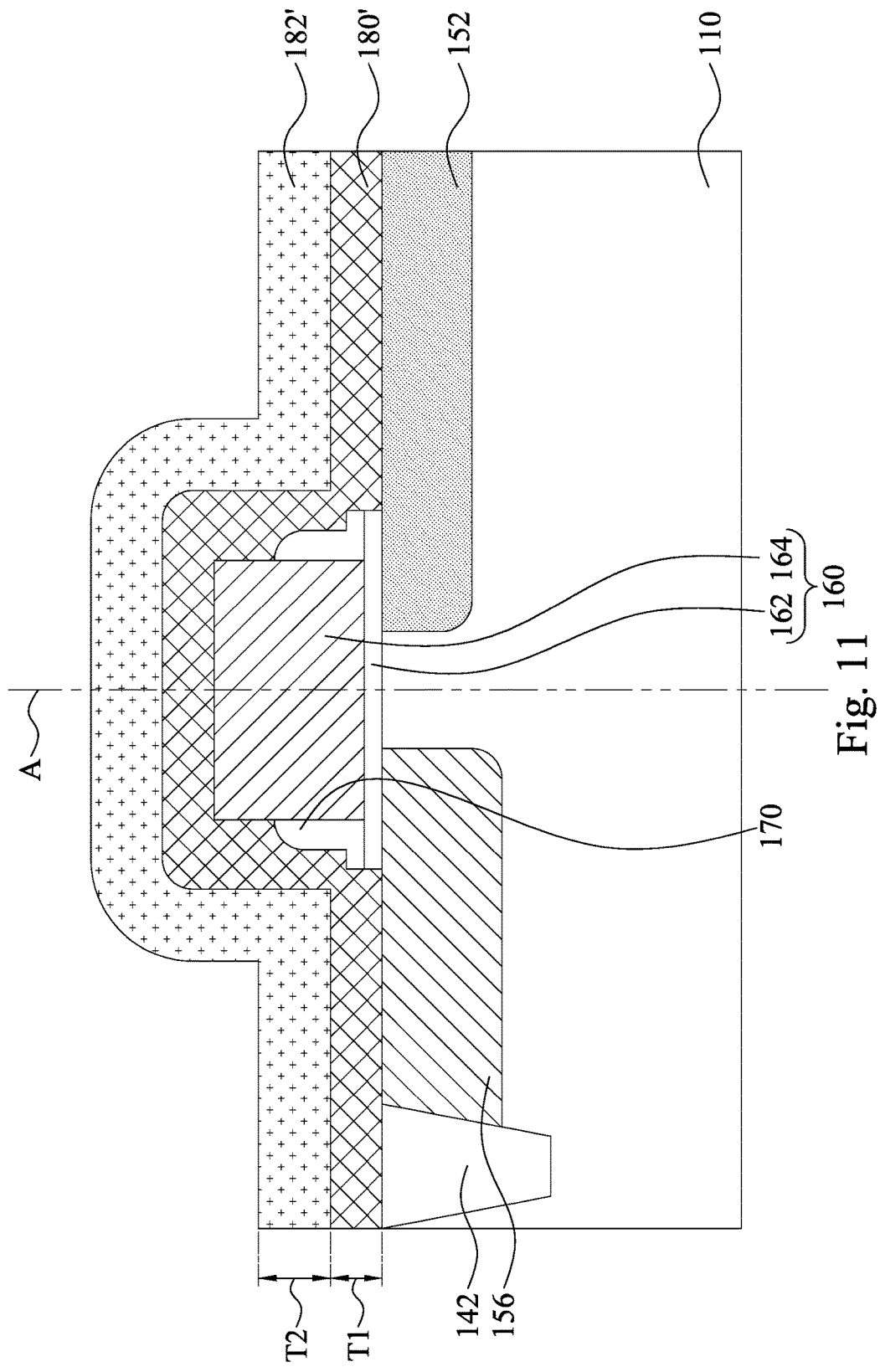

Returning to FIG. 1A, the method M1 then proceeds to block S19 where a third spacer layer is deposited over the second spacer layer. With reference to FIG. 11, in some embodiments of block S19, a third spacer layer 182' is blanket deposited over the second spacer layer 180'. In some embodiments, the third spacer layer 182' may include silicon oxide, silicon nitride, silicon oxynitride, SiCN, $SiC_xO_yN_z$, other suitable materials, or combinations thereof. For example, the third spacer layer 182' may be a dielectric material such as silicon nitride. In some embodiments, the third spacer layer 182' may include a material different than the second spacer layer 180'. In some embodiments, a material of the third spacer layer 182' may be the same as a material of the first gate spacers 170. In some specific embodiments, the first gate spacers 170 and the third spacer layer 182' are formed of silicon nitride, and the second spacer layer 180' is formed of silicon oxide.

Figure 12:
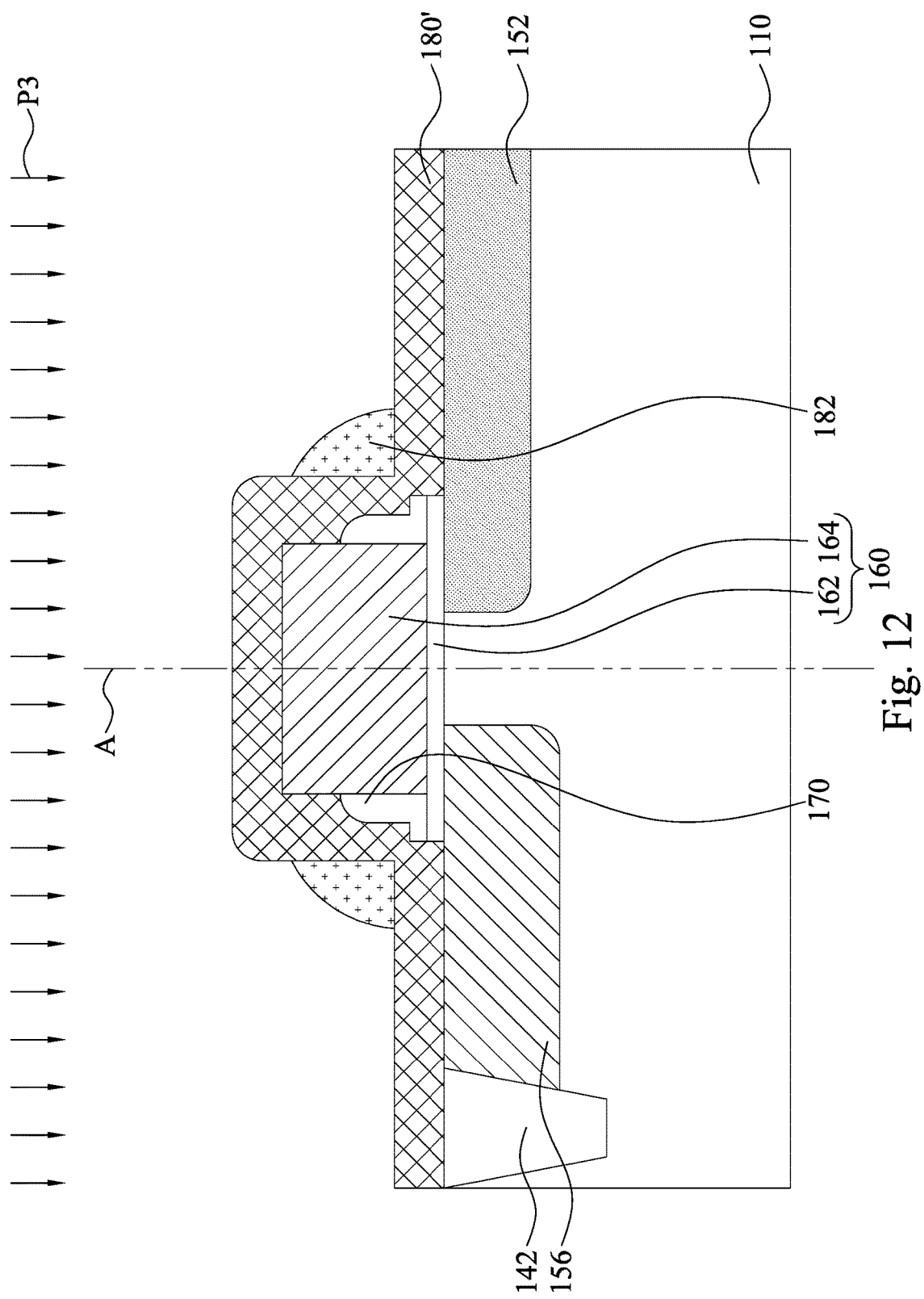
Figure 18:
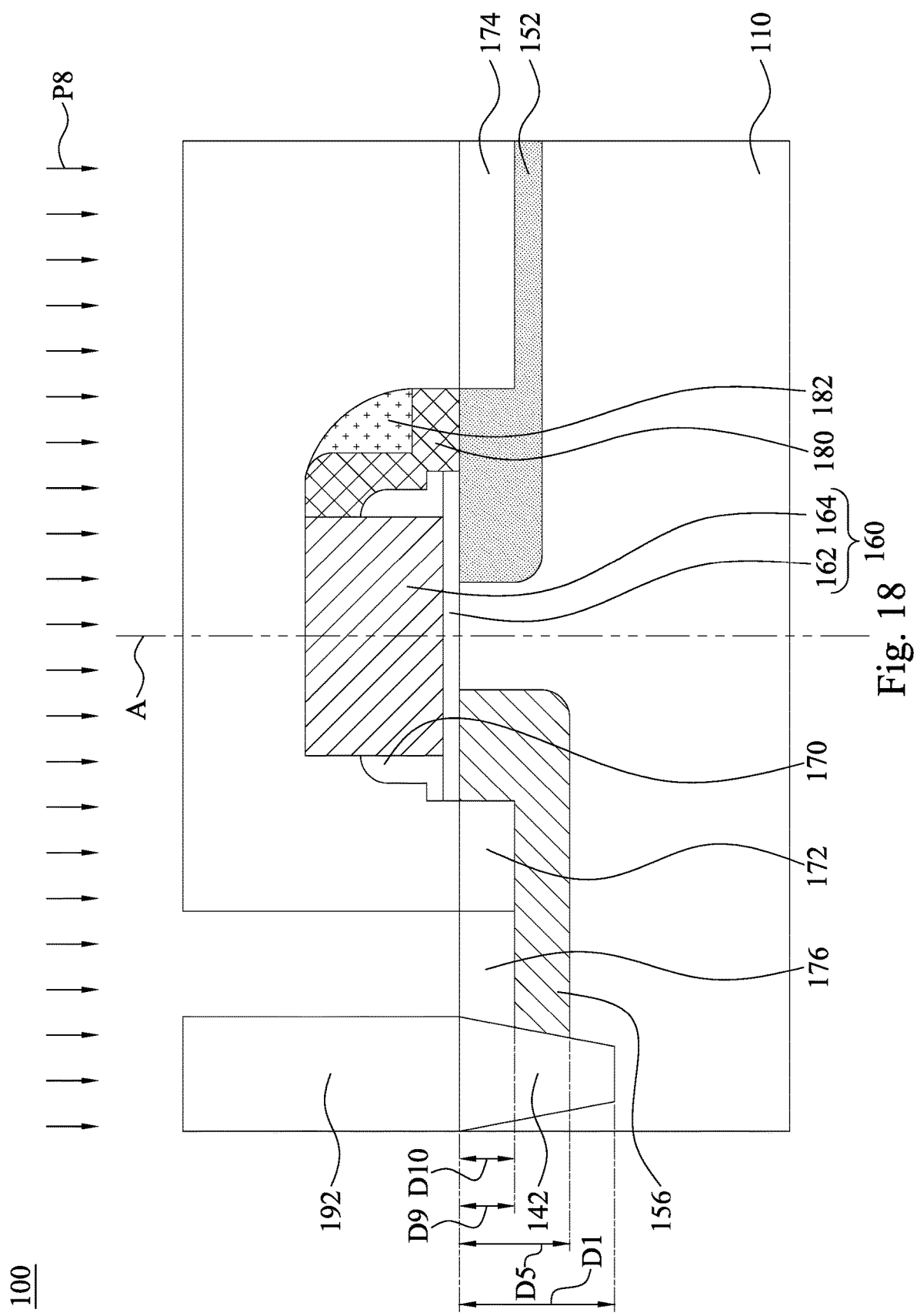
Figure 20:
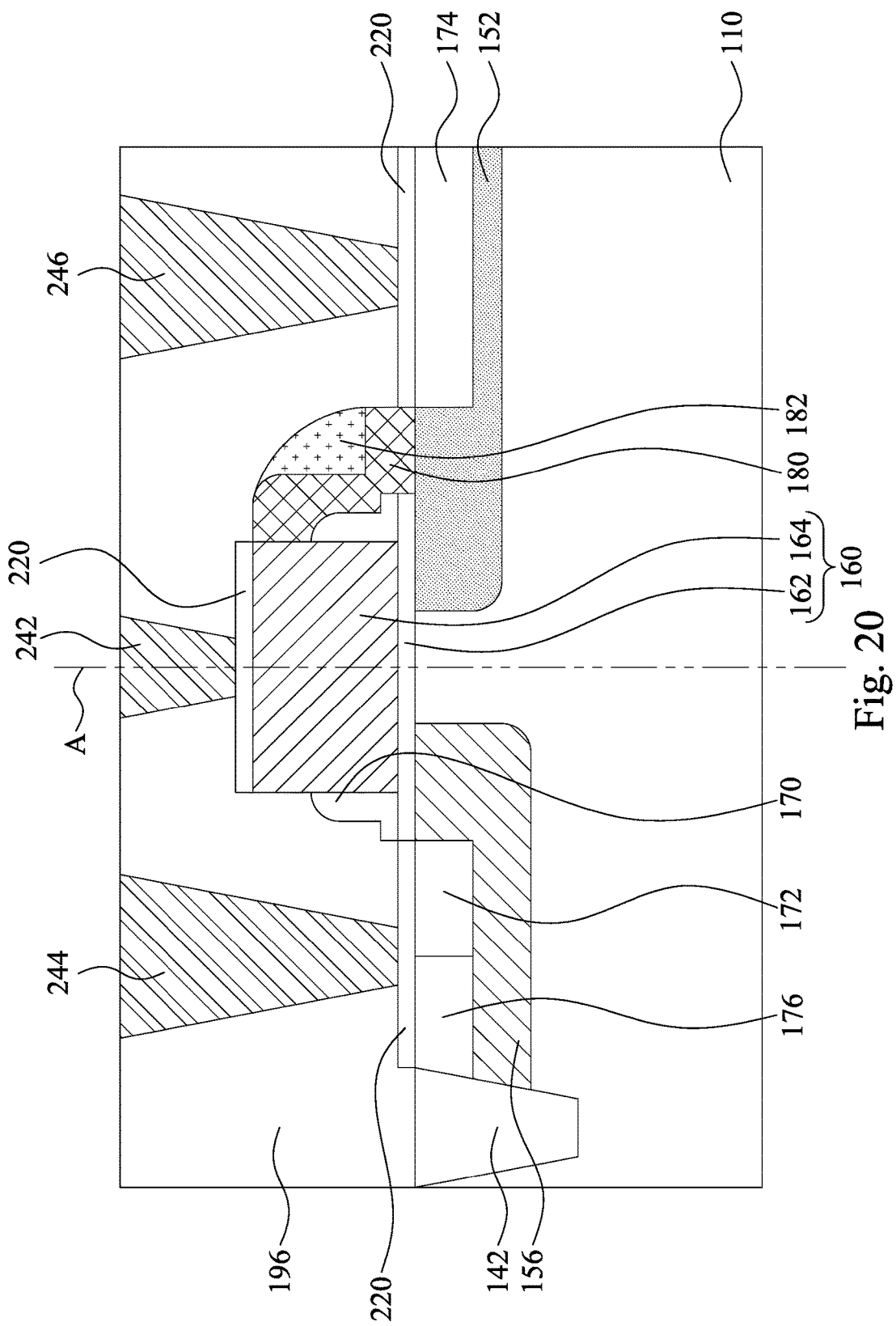

In some embodiments, the third spacer layer 182' may have a multilayer structure. In some embodiments, a thickness T1 of the second spacer layer 180' may be less than a thickness T2 of the third spacer layer 182'. For example, the thickness T1 of the second spacer layer 180' may be in a range from about 10 nm to about 50 nm, and the thickness T2 of the third spacer layer 182' may be in a range from about 50 nm to about 300 nm, and other thickness ranges are within the scope of the disclosure. In some embodiments, if the thickness T1 of the second spacer layer 180' is less than about 10 nm, the second spacer layer 180', polysilicon gate 164, first gate spacer 170, and semiconductor substrate 110 may be damaged in the following etch process P3 (as shown in FIG. 12), and thus the yield may reduce. If the thickness T1 is large than about 50 nm, the top surface of the second spacer 180' may be unwantedly flat so that, when the third spacer etch process P3 is complete, the laterally width of the third spacer 182 may be unable to act as an implantation mask for the following self-aligned implantation process P7 (as shown in FIG. 17). In some embodiments, if the thickness T2 of the third spacer layer 182' is less than about 50 nm, when the third spacer etch process P3 is complete, the laterally width of the third spacer 182 may be unable to act as a mask for the self-aligned implantation process P7. If the thickness T2 is large than about 300 nm, the process time of the etching process P3 may increase and may further damage second spacer layer 180', polysilicon 164, first gate spacer 170, and semiconductor substrate 110, and thus the yield may reduce. Stated differently, the ratio of the thickness T2 to the thickness T1 is in a range from about 1 to about 30, and other thickness ranges are within the scope of the disclosure. In some embodiments, if the ratio of the thickness T2 to the thickness T1 is less than about 1, when the third spacer etch process P3 is complete, a laterally width of the third spacer 182 may be unable to act as a mask for the self-aligned implantation process P7. If the ratio of the thickness T2 to the thickness T1 is greater than about 30, the process time of the etching process P3 may increase and may further damage second spacer layer 180', polysilicon 164, first gate spacer 170, and semiconductor substrate 110, and thus the yield may reduce. The thickness T1 of the second spacer layer 180' and the thickness T2 of the third spacer layer 182' are selected depending on a desired location of subsequently formed drain region (e.g., the drain region 174 as illustrated in FIG. 18) and the silicide region (e.g., silicide region 220 as illustrated in FIG. 20) formed on the drain region. In other words, the thickness T1 of the second spacer layer 180' and the thickness T2 of the third spacer layer 182' are selected to achieve a desired drift region length (e.g., the drift region length S1 as illustrated in FIG. 18). Stated differently, if the thicknesses T1 and T2 are excessively smaller than the selected range, a drift region length may be unwantedly short and thus results in low device breakdown voltage; if the thicknesses T1 and T2 are excessively large than the selected range, a drift region length may be unwantedly long and thus results in poor resistance. In some embodiments, the third spacer layer 182' can be formed using a deposition method, such as plasma enhanced chemical vapor deposition (PECVD), low-pressure chemical vapor deposition (LPCVD), sub-atmospheric chemical vapor deposition (SACVD), or the like.

Returning to FIG. 1B, the method M1 then proceeds to block S20 where the third spacer layer is etched to form third gate spacers over the second spacer layer. With reference to FIG. 12, in some embodiments of block S20, an anisotropic etching process P3 is performed to remove the horizontal portions of the third spacer layer 182'. The etching operation P3 etches the third spacer layer 182' at a faster etch rate than it etches the second spacer layer 180'. By way of example and not limitation, a ratio of the etch rate of the third spacer layer 182' to the etch rate of the second spacer layer 180' may be greater than about 2. If the ratio of the etch rate of the third spacer layer 182' to the etch rate of the second spacer layer 180' is less than about 2, the etching operation P3 would significantly consume the second spacer layer 180', and thus the second spacer layer 180', polysilicon 164, first gate spacer 170, and semiconductor substrate 110 may be damaged, and thus the yield may reduce. In some embodiments, a ratio of the etch rate of the third spacer layer 182' to the etch rate of the second spacer layer 180' may be greater than about 10. In some embodiments, the etching process is performed using an isotropic etching process. In some embodiments, the third spacer layer 182' is etched using, for example, phosphoric acid ($H_3PO_4$).

Figure 13:
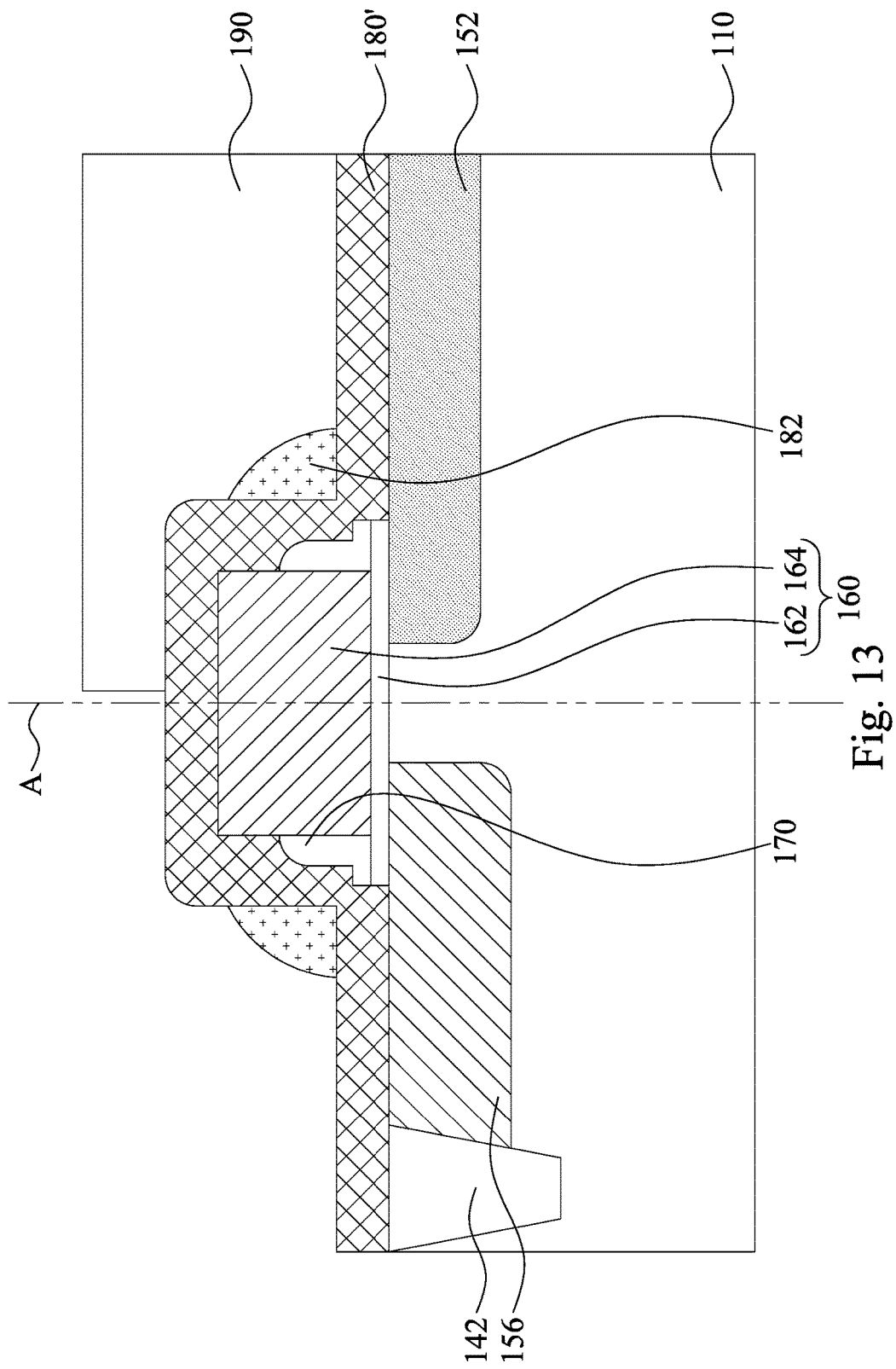

Returning to FIG. 1B, the method M1 then proceeds to block S21 where a first mask layer is formed, in which the first mask layer covers a portion of the gate structure, the first gate spacer, the third gate spacer, and the second spacer layer on a side of the symmetrical axis of the gate structure, and exposes another portion of the gate structure, the first gate spacer, the third gate spacer, and the second spacer layer on another side of the symmetrical axis of the gate structure. With reference to FIG. 13, in some embodiments of block S21, a mask layer 190 is formed over the semiconductor substrate 110 and then patterned to form separated mask portions to cover a portion of the gate structure 160, the first gate spacer 170, the third gate spacer 182, and the second spacer layer 180' on a right side of the symmetrical axis A of the gate structure 160 shown in FIG. 13, and exposes another portion of the gate structure 160, the first gate spacer 170, and third gate spacer 182, and the second spacer layer 180' on a left side of the symmetrical axis A of the gate structure shown in FIG. 13.

In some embodiments, the mask layer 190 may be formed by a photolithography patterning process. The photolithography patterning processes may include photoresist coating (e.g., spin-on coating), soft baking, mask aligning, exposure, post-exposure baking, developing the photoresist, rinsing, drying (e.g., hard baking), and/or other applicable processes.

Figure 14:
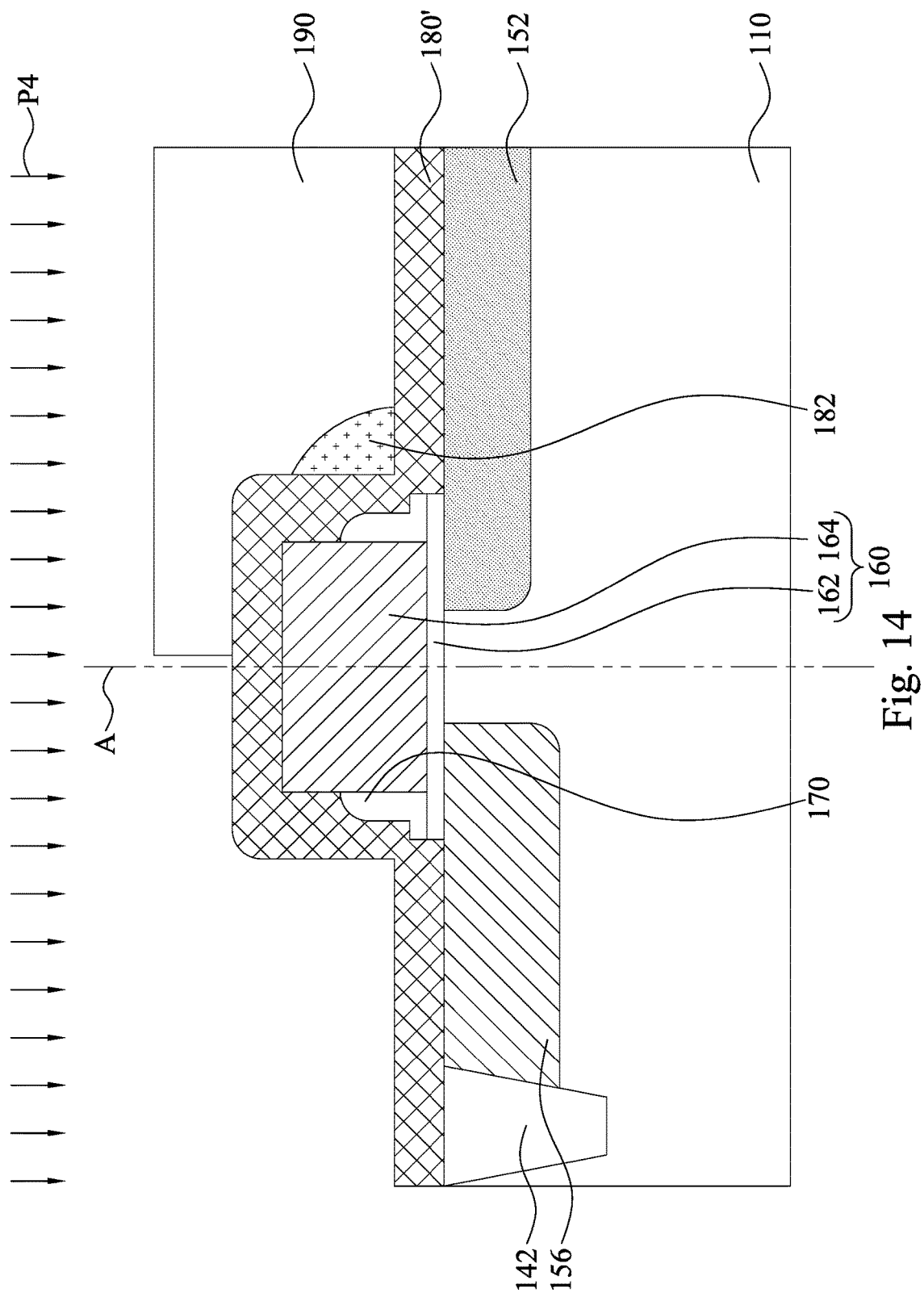

Returning to FIG. 1B, the method M1 then proceeds to block S22 where the third gate spacer exposed by the first mask layer is removed. With reference to FIG. 14, in some embodiments of block S22, one or more etching processes are performed to remove the third gate spacer 182 on the second spacer layer 180 using the mask layer 190 as an etching mask. For example, an etching process P4 is performed to remove the third gate spacer 182 exposed by the mask layer 190. The etching process P4 is a selective etching process that uses an etchant etching the nitride spacer 182 at a faster etch rate than it etches the oxide spacer layer 180'. For example, the etch rate of the etching process P4 to the nitride spacer 182 is greater than about twice the etch rate of the etching process P4 to the oxide spacer layer 180'. If the etch rate of the etching process P4 to the nitride spacer 182 is lower than about twice the etch rate of the etching process P4 to the oxide spacer layer 180', the etching process P4 may excessively consume the second spacer layer 180' and thus the second spacer layer 180', polysilicon 164, first gate spacer 170, and semiconductor substrate 110 may be damaged, and thus the yield may reduce. In this way, the oxide spacer layer 180' remains substantially intact after removing the nitride spacer 182 from the left side of the symmetrical axis A of the gate structure 160. In some embodiments, the etching process is performed using an isotropic etching process. For example, the etchant used in the etching process P4 includes phosphoric acid ($H_3PO_4$).

Figure 15:
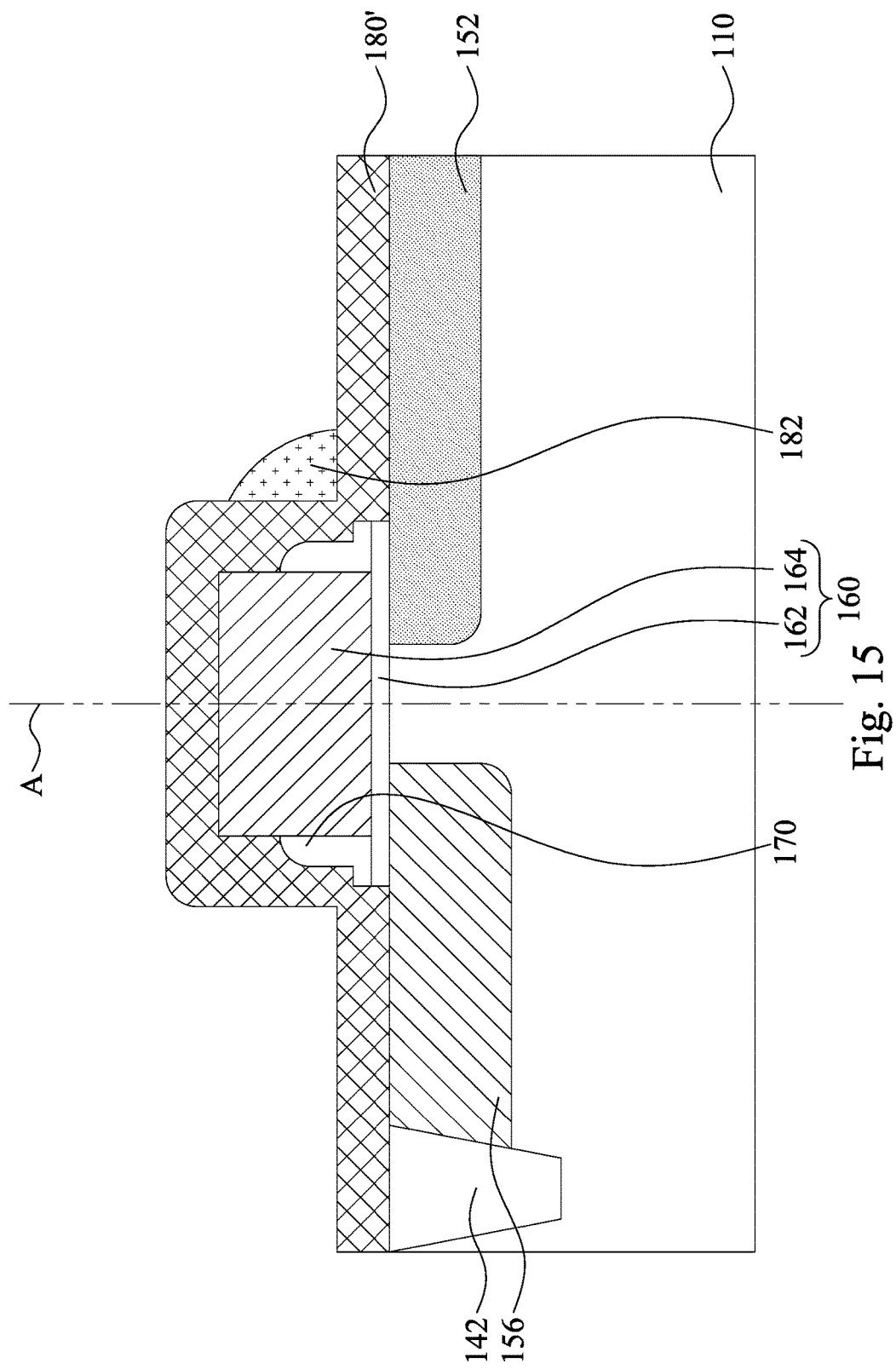

Returning to FIG. 1B, the method M1 then proceeds to block S23 where the first mask layer is removed. With reference to FIG. 15, in some embodiments of block S23, the mask layer 190 is removed after the etching of the third gate spacer 182 and the dielectric layer 180 exposed by the mask layer. For example, the mask layer 190 is stripped by ashing if it is photoresist.

Figure 16:
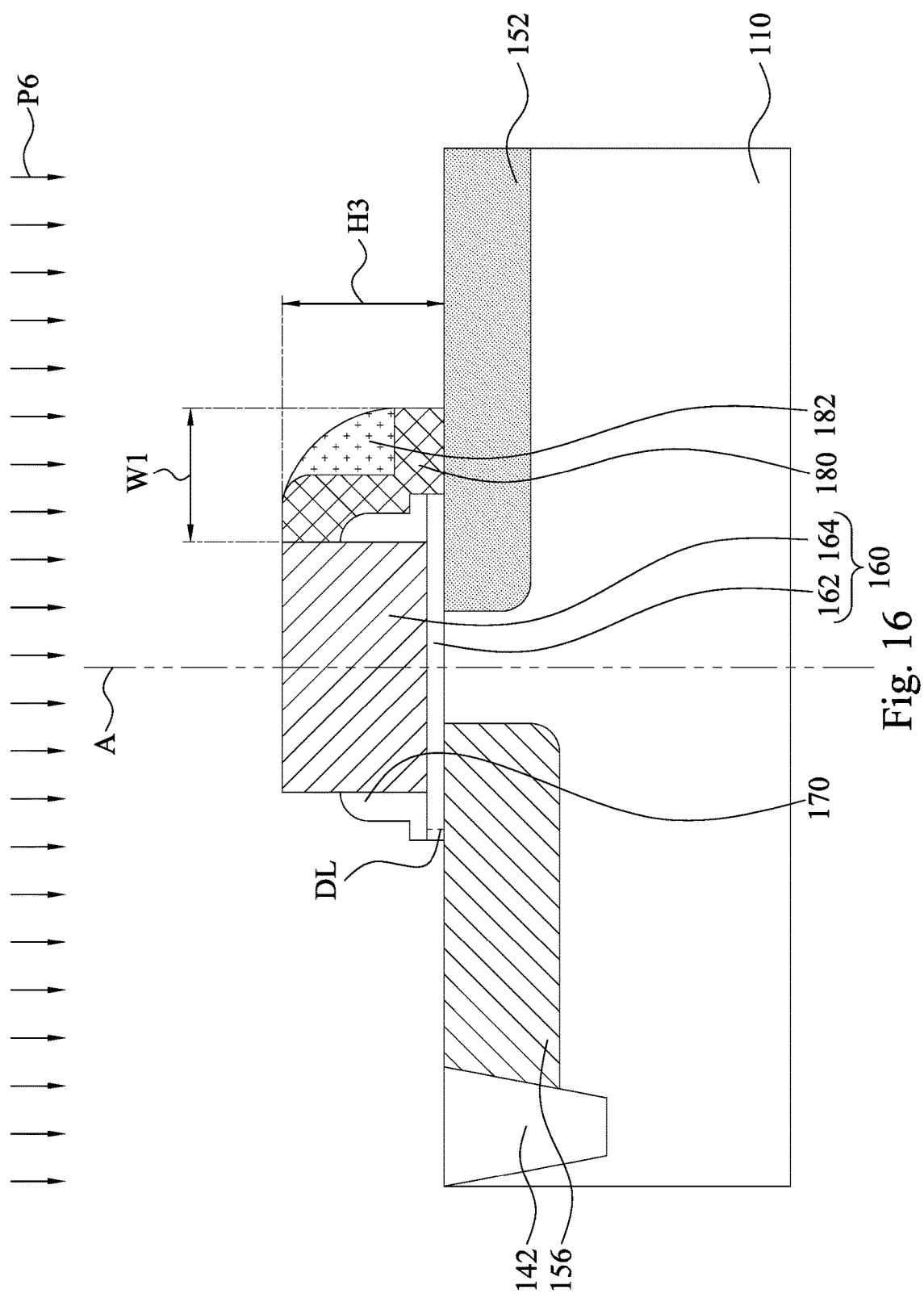

Returning to FIG. 1B, the method M1 then proceeds to block S24 where portions of the second spacer layer not covered by the third gate spacer 182 are removed to form a second gate spacer sandwiched between the first gate spacer and the third gate spacer. With reference to FIG. 16, in some embodiments of block S24, an etching operation P6 is performed to remove a portion of the second spacer layer 180' on the left side of the symmetrical axis A of the gate structure 160 and to remove the horizontal portions of the second spacer layer 180' on the right side of the symmetrical axis A of the gate structure 160 using the third gate spacer 182 as an etching mask, so as to form a second gate spacer 180 on only one side of the gate structure 160 (e.g., only on right side of the gate structure 160). The etching operation P6 is a selective etching process that etches the oxide spacer layer 180' at a faster rate than it etches the nitride spacer 170, the polysilicon gate 164, and the third gate spacer 182. For example, the etch rate of the etching operation P6 to the oxide spacer layer 180' is greater than about ten times the etch rate of the etching operation P6 to the nitride spacer 170, the polysilicon gate 164, and the nitride spacer 182. If the etch rate of the etching operation P6 to the oxide spacer layer 180' is lower than about ten times the etch rate of the etching operation P6 to the nitride spacer 170, the polysilicon gate 164, and the nitride spacer 182, the etching operation P6 may excessively consume the nitride spacer 182 on the right side of the polysilicon gate 164 and the nitride spacer 170 on the left side of the polysilicon gate 164, and thus the excessively consumed nitride spacers 170 and 182 may be unable to act as an implantation mask for the following self-aligned implantation process P7 (as illustrated in FIG. 17), which in turn adversely affects the desired drift region length. In this way, the nitride spacers 170 and 182 and the polysilicon gate 164 remain substantially intact after removing the portions of the second spacer layer 180'.

In FIG. 16, the sidewall of the resulting second gate spacer 180 has a notched corner and the third gate spacer 182 is embedded in the notched corner of the second gate spacer 180. In some embodiments, an outermost sidewall of the third gate spacer 182 is coterminous with an outermost end surface of the second gate spacer 180. The third gate spacer 182 is vertically spaced apart from the substrate 110 by the second gate spacer 180, and laterally spaced apart from the gate electrode 164 by the second gate spacer 180 and the first gate spacer 170. The second and third gate spacers 180 and 182 may in combination function as a silicide blocking layer during a subsequent self-aligned silicidation (salicide) process, which will be discussed in greater detail below. The device area that is intentionally precluded from the silicide process is covered with the second and third gate spacers 180 and 182. This protects the areas under the second and third gate spacers 180 and 182 from the subsequent silicide formation. The NDD region 152 provides a resistive path which acts as a voltage drop in the channel region, and thus the semiconductor device 100 has an improved blocking voltage ability.

The second gate spacer 180 can be defined by applying, for example, an anisotropic etch that partially removes the second spacer layer 180' exposed by the third gate spacer 182. The third gate spacer 182 can thus act as an etching mask during the etching operation P6. Hence, a width W1 of a remainder of the second spacer layer 180' (i.e., the second gate spacer 180) can be controlled by the thickness of the third gate spacer 182, which in turn will control a drift region within the NDD region 152 (i.e., the region in the NDD region 152 except for the subsequently formed drain region), thus facilitating scaling down the drift region length.

The etching operation P6 etches the second spacer layer 180' at a faster etch rate than it etches the third gate spacer 182. By way of example and not limitation, a ratio of the etch rate of the second spacer layer 180' to the etch rate of the third gate spacer 182 may be greater than about 10. If the ratio of the etch rate of the second spacer layer 180' to the etch rate of the third gate spacer layer 182' is less than about 10, the etching operation P6 would significantly consume the third gate spacer 182, and thus the third gate spacer 182 may be unable to act as an etching mask during the etching operation P6, which in turn adversely affects the desired drift region length. In some embodiments, a ratio of the etch rate of the second spacer layer 180' to the etch rate of the third gate spacer 182 may be greater than about 10. In some embodiments, the second spacer layer 180' is etched using, for example, liquid hydrogen fluoride (HF) or vapor HF in case silicon oxide is used as the oxide spacer layer 180'. In some embodiments where the gate dielectric layer 162 is silicon oxide, the left end of the gate dielectric layer 162 may be recessed by the etchant used in the etching process P6, as indicated by the dash line DL.

Returning to FIG. 1B, the method M1 then proceeds to block S25 where N-type source and drain regions are formed in the NDD or the p-body region. With reference to FIG. 17, in some embodiments of block S25, a self-aligned implantation process P7 is performed to dope an N-type dopant into the p-body region 156 and the NDD region 152, thus forming an N-type source region 172 in the p-body region 156 and the N-type drain region 174 in the NDD region 152. Moreover, the self-aligned implantation process P7 also dopes the N-type dopant into the polysilicon gate 164. Because the oxide spacer 180 has been removed from the top surface of the polysilicon gate 164 in the previous etching process P6 as illustrated in FIG. 16, the polysilicon gate 164 can be implanted through the entire top surface of the polysilicon gate 164, which in turn will reduce un-doped region in the polysilicon gate 164. Before performing the self-aligned implantation process P7, a mask layer 194 is formed over the semiconductor substrate 110 and then patterned to form separated mask portions to cover a portion of the p-body region 156 adjacent to the isolation structure 142, thus defining a target location of the N-type source region 172, and the mask layer 194 is removed after the formation of the N-type source region 172 and the N-type drain region 174. For example, an ion implantation may be performed to implant an n-type dopant, such as arsenic or phosphorus, at a vertical angle to form the N-type drain region 174 in the NDD region 152 using the spacers 170, 180 and 182 and the patterned mask layer 194 as an implant mask. Because ions of n-type dopant are directed at a vertical angle (i.e., perpendicular to the top surface of substrate 110), the resulting N-type source region 172 has a left boundary substantially aligned with the patterned mask layer 194 and a right boundary substantially aligned with the left-side nitride spacer 170, and the N-type drain region 174 has a left boundary substantially aligned with the outermost end surface of the oxide spacer 180 and an outermost end of the right-side nitride spacer 182. Because in the implantation process P7 the left boundary of the N-type drain region 174 is self-aligned to the outermost end surface of the oxide spacer 180, and the right boundary of the N-type source region 172 is self-aligned to the outermost end surface of the left-side nitride spacer 170, the implantation process P7 is referred to as a self-aligned implantation process in this context.

In greater detail, the second and third gate spacers 180 and 182 may function as an implanting blocking layer during the self-aligned implantation process P7 with a vertical implantation angle, and thus the N-type drain region 174 is self-aligned with outermost sidewalls of the second and third spacers 180 and 182. As such, an outermost end surface of the second gate spacer 180 is coterminous with a boundary between the N-type drain region 174 and the NDD region, and thus the second and third gate spacers 180 and 182 may not overlap with the N-type drain region 174. However, in some embodiments, the N-type drain region 174 may laterally extends past the outermost end surface of the second gate spacer 180 due to unintentional thermal diffusion occurring in following steps of the front-end-of-line (FEOL) process and the back-end-of-line (BEOL) process.

In some embodiments, the N-type drain region 174 is separated from a channel region 110c in the substrate 110 by a distance S1 (interchangeably referred to as a drift region length). The drift region length S1 depends on the width W1 of the second and third gate spacers 180 and 182. As such, the drift region can be scaled down by controlling the width W1 of the second and third gate spacers 180 and 182, which depends on the thickness of the second spacer layer 180' and the thickness of the third spacer layer 182', as illustrated in FIG. 11. Therefore, the drift region length S1 can be controlled by the thicknesses of the second and third spacer layers 180' and 182'. For example, the drift region length S1 can be in a range from about 0.05 um to about 0.5 um, and other drift region length ranges are within the scope of the disclosure. In some embodiments, if the drift region length S1 is less than about 0.05 um, it may result in excessively low device breakdown voltage, and if the drift region length S1 is large than about 0.5 um, it may result in excessively high resistance.

In some embodiments, the mask layer 194 may be formed by a photolithography patterning process. The photolithography patterning processes may include photoresist coating (e.g., spin-on coating), soft baking, mask aligning, exposure, post-exposure baking, developing the photoresist, rinsing, drying (e.g., hard baking), and/or other applicable processes.

The N-type source region 172 and the N-type drain region 174 are N+ regions (interchangeably referred to as heavily doped N-type regions) having n-type impurity concentration greater than that of the NDD region 152 and the p-body region 156. In some embodiments, the N-type source region 172 and the N-type drain region 174 include n-type dopants such as P or As. A rapid thermal annealing (RTA) process may be performed after the self-aligned implantation process P7 to activate the implanted dopant in the polysilicon gate 164 and the N-type source/drain regions 172 and 174.

As illustrated in FIG. 17, a depth D8 of the N-type drain region 174 may be less than the depth D4 of the NDD region 152 and/or the depth D1 of the isolation structure 142. For example, the depth D8 of the N-type drain region 174 may be in a range of about 0.1 um to about 0.5 um, and other depth ranges are within the scope of the disclosure. In some embodiments, the depth D8 of the N-type drain region 174 may be greater than the depth D4 of the NDD region 152 and/or the depth D1 of the isolation structure 142. In FIG. 17, a depth D9 of the N-type source region 172 may be less than the depth D5 of the p-body region 156 and/or the depth D1 of the isolation structure 142. For example, the depth D9 of the N-type drain region 174 may be in a range of about 0.1 um to about 0.5 um, and other depth ranges are within the scope of the disclosure. In some embodiments, a depth D9 of the N-type source region 172 may be greater than the depth D5 of the p-body region 156 and/or the depth D1 of the isolation structure 142. In some embodiments, the depth D9 of the N-type source region 172 is comparable to the depth D8 of the N-type drain region 174, because they are formed using a same implantation process P7.

In some embodiments, the dopant concentration of each of the N-type source region 172 and the N-type drain region 174 may be between about 1020 and about 1021 per cubic centimeter, and other dopant concentration ranges are within the scope of the disclosure. As illustrated in FIG. 17, a lateral distance between the N-type drain region 174 and the gate structure 160 is greater than a lateral distance between the N-type source region 172 and the gate structure 160, and thus the LDMOS transistor has source/drain regions 172 and 174 asymmetric with respect to the gate structure 160. Moreover, the drain region 174 has a width W3 that is greater than the width W4 of the source region 172. By way of example and not limitation, a ratio of the width W3 of the drain region 174 to the width W4 of the source region 172 is greater than 2, and other ranges of ratio are within the scope of the disclosure.

Returning to FIG. 1B, the method M1 then proceeds to block S26 where a P-type body contact region is formed in the p-body region. With reference to FIG. 18, in some embodiments of block S26, for example, the mask layer 194 shown in FIG. 17 is stripped by ashing if it is photoresist, and then a mask layer 192 is formed over the semiconductor substrate 110 and then patterned to cover the N-type source and drain regions 172 and 174 and the N-doped polysilicon gate 164. Then, an implantation process P8 is performed to implant a p-type dopant in the p-body region 156 using the mask layer 192 as an implant mask, thus forming a P-type body contact region 176 in the p-body region 156. The mask layer 192 is removed after the formation of the P-type body contact region 176. In some embodiments where the mask layer 192 is photoresist, the mask layer 192 is stripped by ashing after the formation of the P-type body contact region 176 is complete.

In some embodiments, the mask layer 192 may be formed by a photolithography patterning process. The photolithography patterning processes may include photoresist coating (e.g., spin-on coating), soft baking, mask aligning, exposure, post-exposure baking, developing the photoresist, rinsing, drying (e.g., hard baking), and/or other applicable processes.

The P-type body contact region 176 may be P+ or heavily doped regions having p-type impurity concentration greater than the P-body region 156. In some embodiments, the P-type body contact region 176 includes p-type dopants such as boron or boron difluoride ($BF_2$). The P-type body contact region 176 may be formed by a method such as ion implantation or diffusion. A rapid thermal annealing (RTA) process may be performed after the implantation process P8 to activate the implanted dopant. As illustrated in FIG. 18, the P-type body contact region 176 is formed in the p-body region 156 and between the N-type source region 172 and the isolation structure 142. In the depicted embodiments, the P-type body contact region 176 is formed after forming the formation of the second and third gate spacers 180 and 182. In some other embodiments, the P-type body contact region 176 may be formed before the formation of the N-type source region 172 and the N-type drain region 174.

In some embodiments, a depth D10 of the P-type body contact region 176 may be less than the depth D5 of the P-body region 156 and the depth D1 of the isolation structure 142 shown in FIG. 3. In some other embodiments, the depth D10 of the P-type body contact region 176 may be greater or less than the depth D9 of N-type source region 172. In some embodiments, the depth D10 of the P-type body contact region 176 may be comparable to the depth D9 of N-type source region 172. For example, the depth D10 of the P-type body contact region 176 may be in a range from about 0.1 um to about 0.5 um, and other depth ranges are within the scope of the disclosure. In some embodiments, the dopant concentration of each of the P-type body contact region 176 may be between about $10^{20}$ and about $10^{21}$ per cubic centimeter, and other dopant concentration ranges are within the scope of the disclosure.

Figure 19:
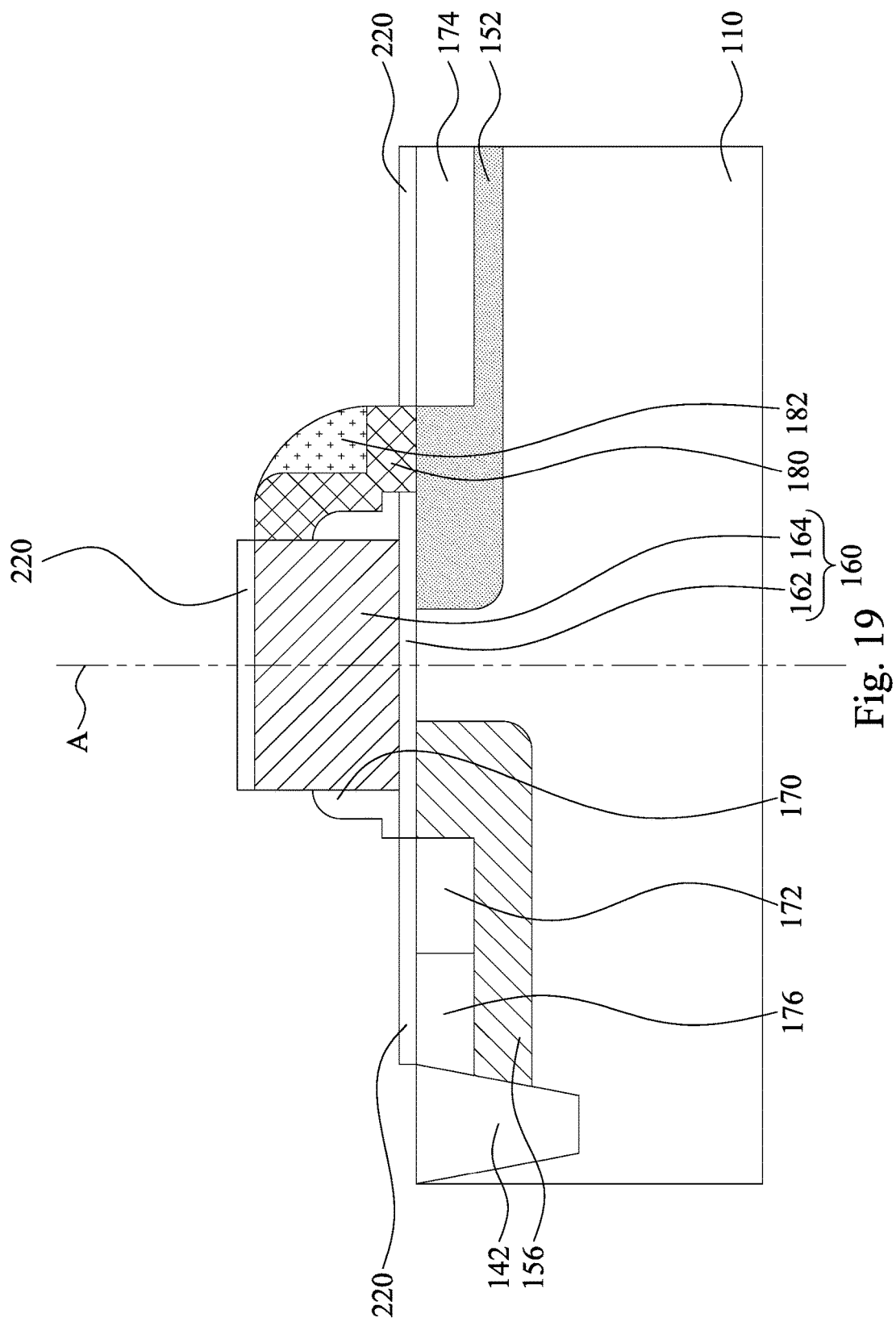

Returning to FIG. 1B, the method M1 then proceeds to block S27 where metal alloy layers are respectively formed above the gate structure, the N-type source/drain region, and the P-type source/drain region. With reference to FIG. 19, in some embodiments of block S27, metal alloy layers 220 may be formed by self-aligned silicidation (salicide) process. In an exemplary salicide process, a metal material (e.g., cobalt, nickel or other suitable metal) is formed over the substrate, then the temperature is raised to anneal and cause a reaction between the metal material and the underlying silicon/polysilicon so as to form silicide layers 220, and the unreacted metal is etched away. The silicide material is self-aligned with the N-type source region 172 and the N-type drain region 174, the P-type body contact region 176, and/or the gate electrode 164 to reduce contact resistance.

In FIG. 19, one of the metal alloy layers 220 is in contact with an entirety of a top surface of the N-type drain region 174 within the NDD region 152 and the outermost end surface of the second gate spacer 180. Other region of the NDD region 152 that is intentionally precluded from the silicide process is covered with the second and third gate spacers 180 and 182. This protects the NDD region 152 below the second and third gate spacers 180 and 182 from the silicide formation. One of the metal alloy layers 220 is in contact with an entirety of a top surface of the gate electrode 164 to lower a resistance of the gate. One of the metal alloy layers 220 is in contact with an entirety of a top surface of N-type source region 172 and a top surface of the P-type body contact region 176 and thus extends across an interface between the N-type source region 172 and the P-type body contact region 176.

Returning to FIG. 1B, the method M1 then proceeds to block S28 where contacts are respectively formed above the metal alloy layers. With reference to FIG. 20, in some embodiments of block S28, an interlayer dielectric (ILD) layer 196 is formed above the structure in FIG. 19. In some embodiments, the ILD layer 196 includes a material having a low dielectric constant such as a dielectric constant less than about 3.9. For example, the ILD layer 196 may include silicon oxide. In some embodiments, the dielectric layer includes silicon dioxide, silicon nitride, silicon oxynitride, polyimide, spin-on glass (SOG), fluoride-doped silicate glass (FSG), carbon doped silicon oxide, Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, and/or other suitable materials. The ILD layer 196 may be formed by a technique including spin-on coating, CVD, or other suitable processes.

Then, a plurality of contacts 242, 244, and 246 are formed in the ILD layer 196 to contact the respective metal alloy layers 220 (i.e., silicide layers 220). For example, a plurality of the openings are formed in the ILD layer 196, and conductive materials are then deposited in the openings. The excess portions of the conductive materials outside the openings are removed by using a CMP process, while leaving portions in the openings to serve as the contacts 242, 244, and 246. The contacts 242, 244, and 246 may be made of tungsten, aluminum, copper, or other suitable materials. In some embodiments, the contact 242 is electrically connected to the gate structure 160 via the metal alloy layer 220 atop the gate structure 160, the contact 244 is connected to the P-type body contact region 176 and the N-type source region 172 by the metal alloy layer 220 spanning the to the P-type body contact region 176 and the N-type source region 172, and the contact 246 is connected to the N-type drain region 174 by the metal alloy layer 220 atop the N-type drain region 174. In the depicted embodiments, the P-type body contact region 176 and the N-type source region 172 share a same contact 244. In some other embodiments, the P-type body contact region 176 and the N-type source region 172 may be separated from each other and electrically connected to separate contacts.

Figure 21:
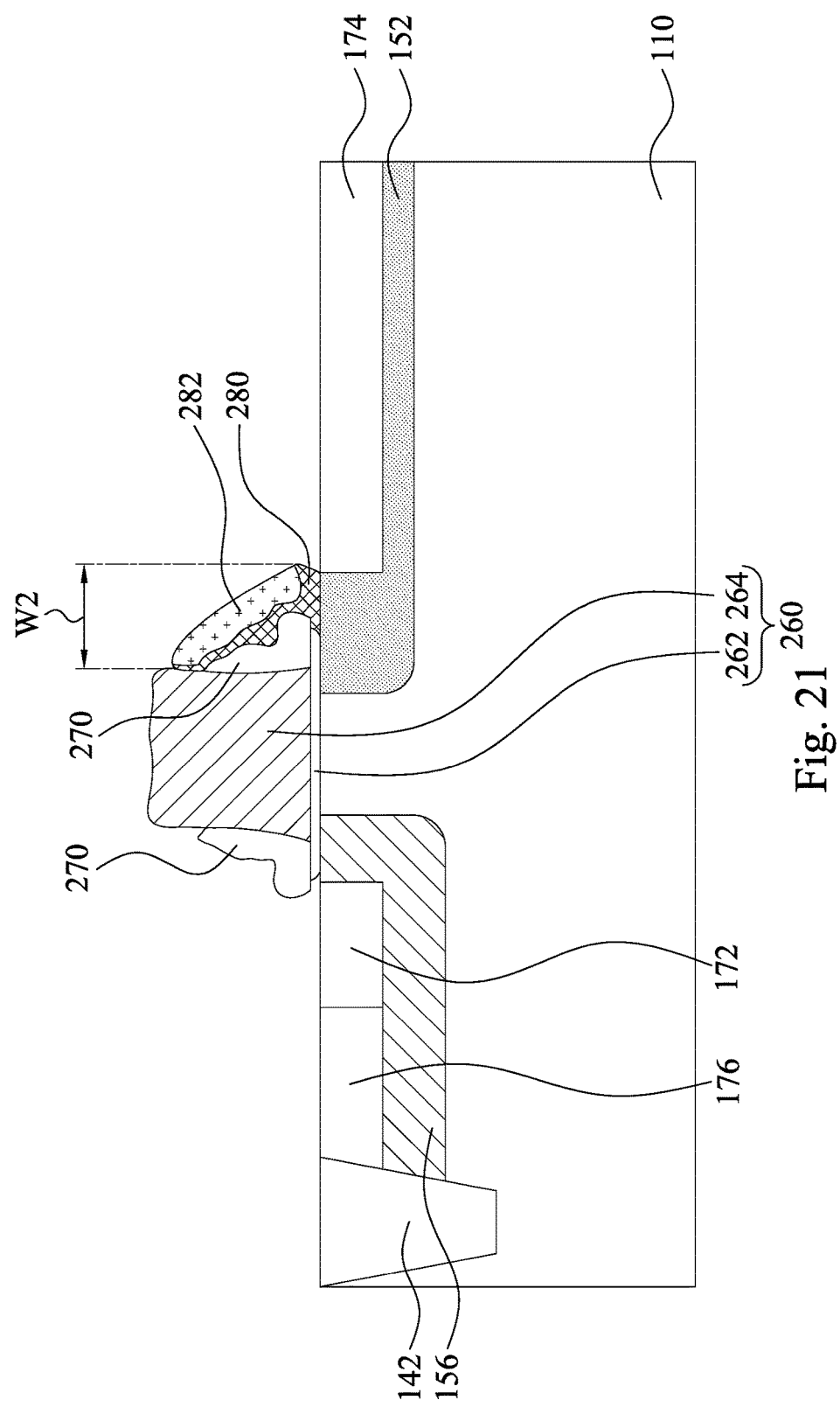
FIGS. 21 and 22 illustrate a method for manufacturing a semiconductor device in different stages in accordance with some embodiments.
Figure 22:
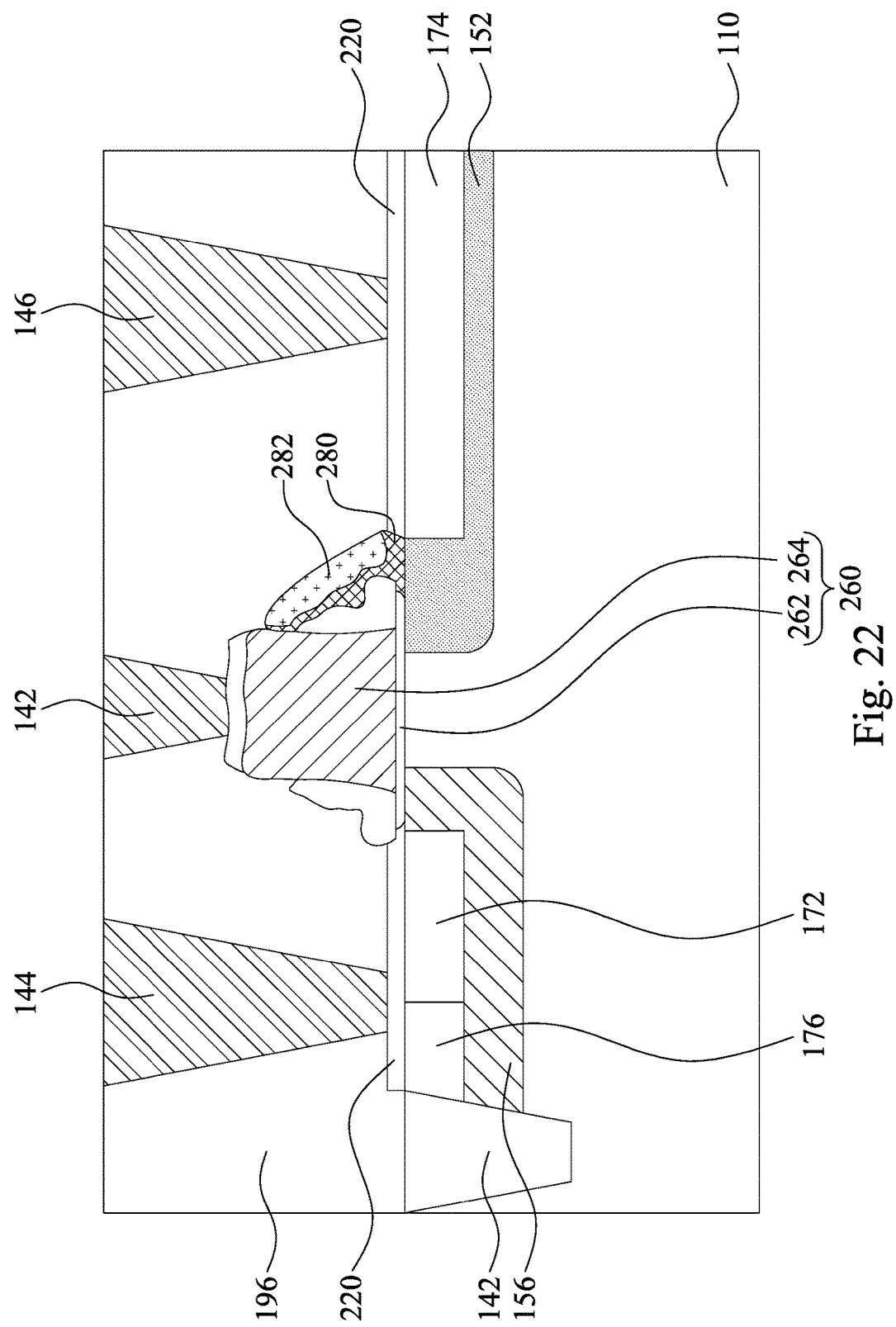

Reference is made to FIGS. 21 and 22. FIGS. 21 and 22 illustrate a method for manufacturing a semiconductor device 200 in different stages in accordance with some embodiments. Operations for forming the semiconductor device 200 are substantially the same as the operations for forming the semiconductor device 100 described in foregoing descriptions and thus are not repeated herein for the sake of clarity. FIGS. 21 and 22 illustrates a more practical profile of the LDMOS manufactured using the method M1 of FIGS. 19 and 20.

FIG. 21 illustrates a semiconductor device 200 at a stage corresponding to FIG. 19 according to some alternative embodiments of the present disclosure. As shown in FIG. 21, a top end of the third gate spacer 282 and a top end of the second gate spacer 280 may be lower than a top surface of the gate electrode 264. Moreover, the top end of the third gate spacer 282 may be lower than the top end of the second gate spacer 280 due to the nature of the etching processes P3 and P6. Moreover, the gate dielectric layer 262 has a left end set back from an outermost end of the left first spacer 270, due to the nature of the etching process P6 that etches oxide materials. However, the right end of the gate dielectric layer 262 may be still coterminous with an outermost end of the right first spacer 270, because the right end of the gate dielectric layer 262 is covered and thus protected by the photoresist mask 190.

FIG. 22 illustrates a semiconductor device 200 at a stage corresponding to FIG. 20 according to some alternative embodiments of the present disclosure. As shown in FIG. 22, one of the metal alloy layers 220 is in contact with an entirety of a top surface of the N-type drain region 174 within the NDD 152 and an outermost end surface of the second gate spacer 280. The area of the NDD region 152 that is intentionally precluded from the silicide process is covered with the second and third gate spacers 280 and 282. This protects the NDD region 152 below the second and third gate spacers 280 and 282 from the silicide formation. Hence, the NDD region 152 provides a resistive path which acts as a voltage drop in the channel region, and thus the semiconductor device 200 has an improved blocking voltage ability. One of the metal alloy layers 220 is in contact with an entirety of a top surface of the gate electrode 264 to lower a resistance of the gate. One of the metal alloy layers 220 spans the N-type source region 172 and the P-type body contact region 176.

Figure 23A:
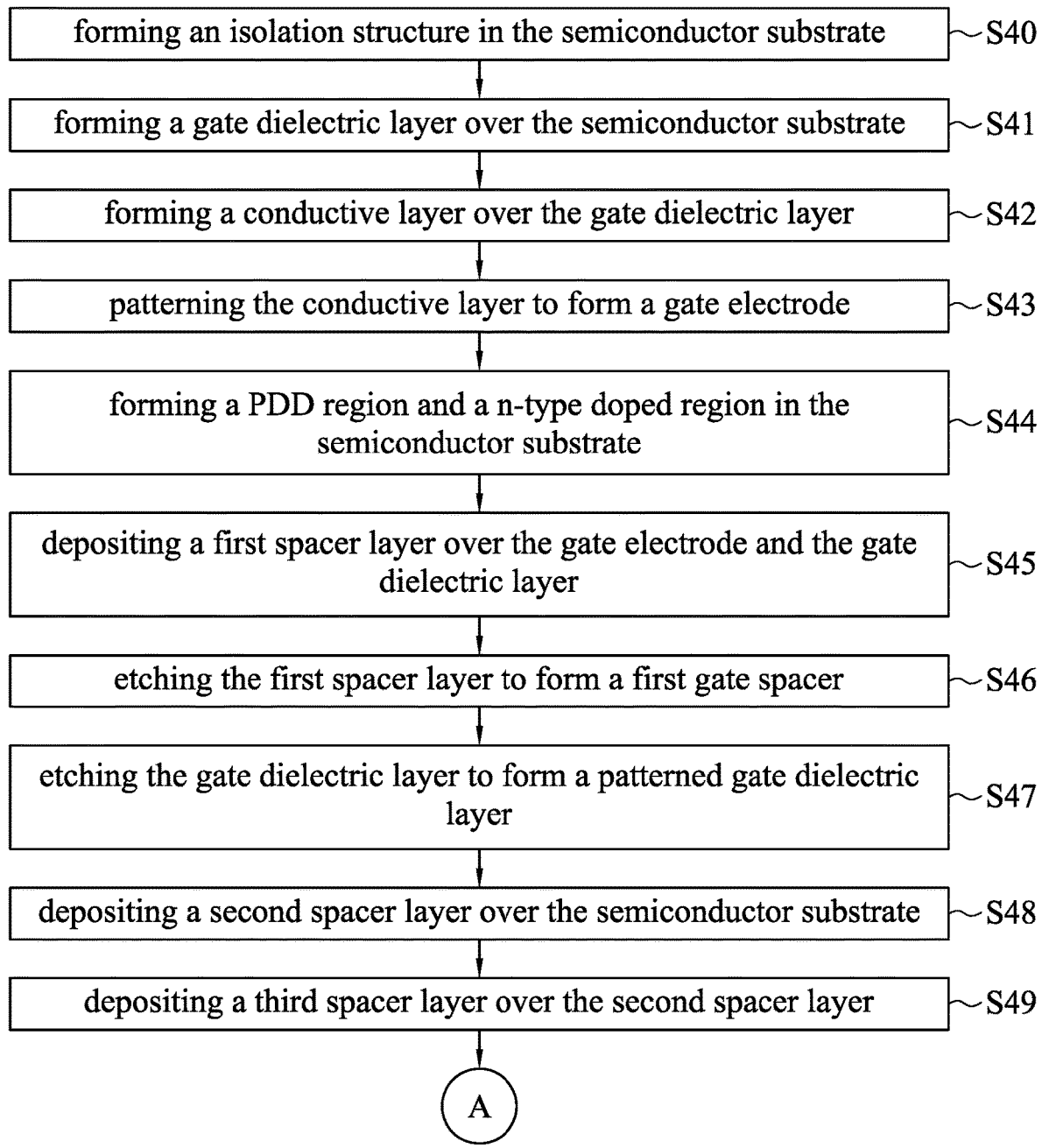
FIGS. 23A and 23B illustrate a block diagram of a method of forming a semiconductor device in accordance with some embodiments.
Figure 23B:
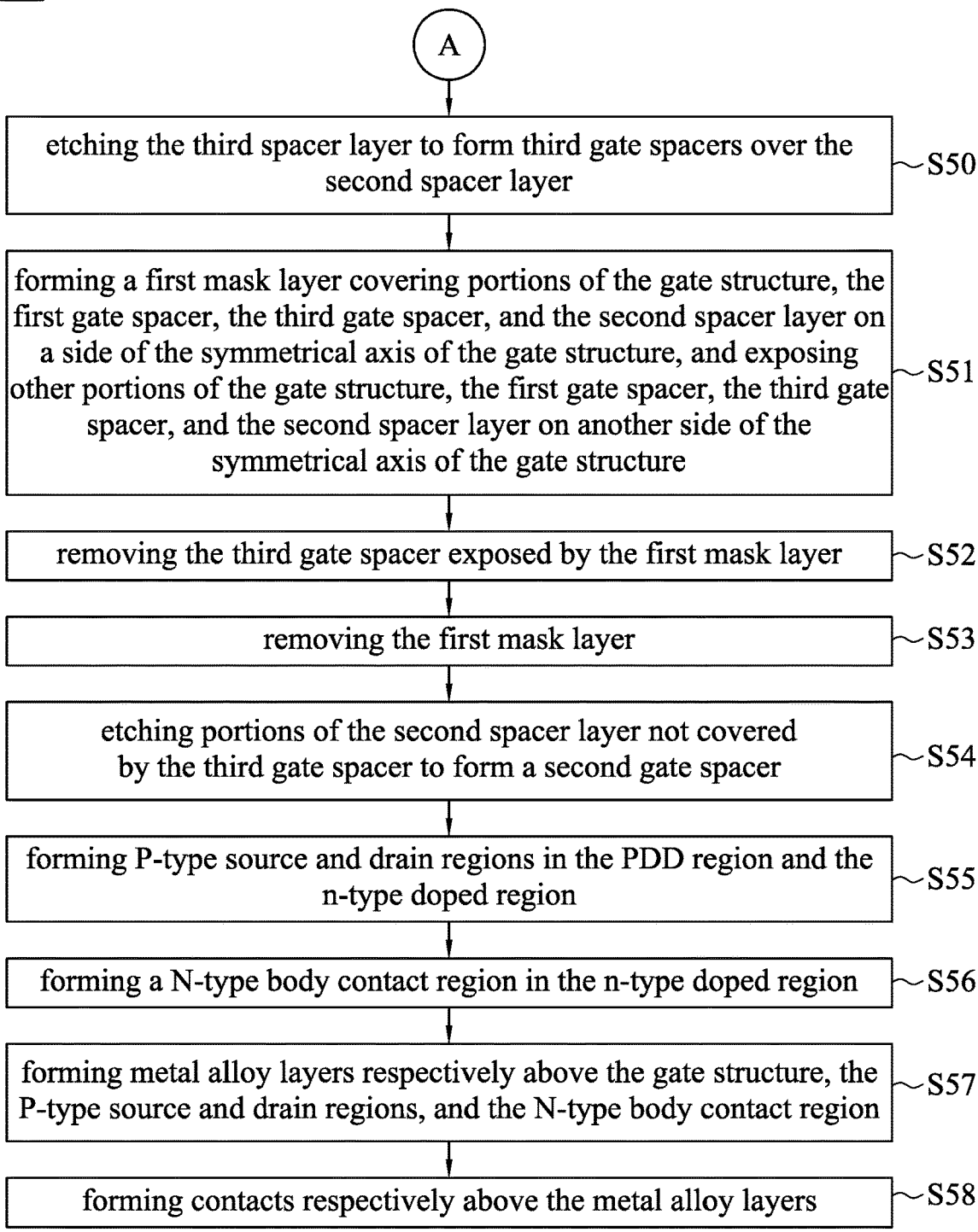
Figure 24:
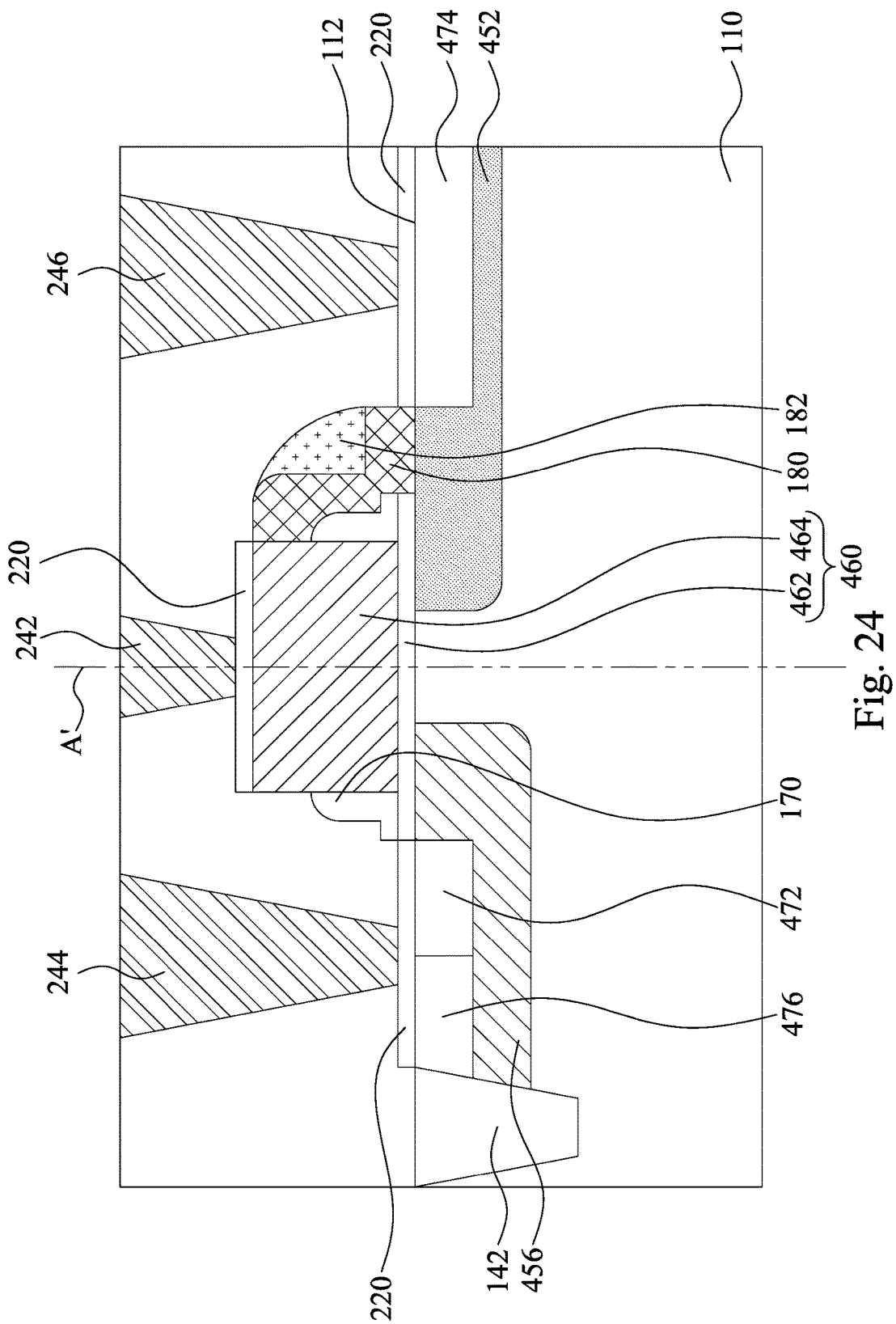
FIG. 24 illustrates a method for manufacturing a semiconductor device in a stage in accordance with some embodiments.

Referring now to FIGS. 23A and 23B, illustrated is an exemplary method M2 for fabrication of a semiconductor device in accordance with some embodiments, in which the fabrication includes a self-aligned implantation and silicidation process of a semiconductor device. FIG. 24 illustrates an LDMOS transistor fabricated using the method M2. The method M2 includes a relevant part of the entire manufacturing process. It is understood that additional operations may be provided before, during, and after the operations shown by FIGS. 23A and 23B, and some of the operations described below can be replaced or eliminated for additional embodiments of the method. The order of the operations/processes may be interchangeable. The method M2 includes fabrication of a semiconductor device 400. However, the fabrication of the semiconductor device 400 is merely example for describing the self-aligned process of the semiconductor device 400 according to some embodiments of the present disclosure.

With reference to FIG. 24, at block S40, an isolation structures 142 such as shallow trench isolations (STI) or local oxidation of silicon (LOCOS) (or field oxide, FOX) including isolation features may be formed in a semiconductor substrate 110 to define and electrically isolate various active regions so as to prevent leakage current from flowing between adjacent active regions.

At block S41, a gate dielectric layer is formed over the semiconductor substrate 110. At block S42, a conductive layer is formed over the gate dielectric layer. In some embodiment, the conductive layer may include polycrystalline silicon (interchangeably referred to as polysilicon). At block S43, the conductive layer is patterned to form a gate electrode 464 on the gate dielectric layer. At block S44, a p-type double diffused doped (PDD) region 452 is formed in the semiconductor substrate 110 and in the vicinity of the top surface 112 of the semiconductor substrate 110, and an n-type doped region 456 (interchangeably referred to as a n-body region) is formed in the semiconductor substrate 110 and in the vicinity of the top surface 112 of the semiconductor substrate 110. At block S45, a first spacer layer is blanket deposited over the PDD region 452, the n-body region 456, the gate dielectric layer, the gate electrode 464, and the isolation features 142. At block S46, the first spacer layer is etched to form a first gate spacer 170. At block S47, the gate dielectric layer is patterned to form a gate dielectric layer 462 below the gate electrode 464, and the gate dielectric layer 462 and the gate electrode 464 are defined as a gate structure 460.

At block S48, a second spacer layer is blanket deposited over the PDD region 452, the n-body region 456, the gate dielectric layer 462, the gate electrode 464, the first gate spacer 170, and the isolation features 142. At block S49, a third spacer layer is blanket deposited over the second spacer layer. At block S50, an etching operation is performed to remove the horizontal portions of the third spacer layer.

At block S51, a first mask layer is formed over the semiconductor substrate 110 and then patterned to form separated mask portions to cover a portion of the gate structure 460, the first gate spacer 170, the third gate spacer 482, and the second spacer layer on a right side of the symmetrical axis A of the gate structure 160 shown in FIG. 24, and exposes another portion of the gate structure 460, the first gate spacer 170, and third gate spacer 482, and the second spacer layer on a left side of the symmetrical axis A of the gate structure shown in FIG. 24. At block S52, one or more etching processes are performed to remove the third gate spacer 482 on the second spacer layer using the first mask layer as an etching mask.

At block S53, the first mask layer is removed after the etching of the third gate spacer 482. At block S54, an etching operation is performed to remove a portion of the second spacer layer on the left side of the symmetrical axis A of the gate structure 460 and to remove the horizontal portions of the second spacer layer on the right side of the symmetrical axis A of the gate structure 460 using the third gate spacer 482 as an etching mask, so as to form a second gate spacer 480 on only one side of the gate structure 460 (e.g., only on right side of the gate structure 460). At block S55, P-type source and drain regions 474 and 472 are formed in the PDD region 452 and the n-body region 456 by a self-aligned process. At block S56, an N-type body contact region 476 is formed in the n-body region 456.

At block S57, metal alloy layers 220 may be self-aligned to be formed on various features such as the P-type source and drain regions 472 and 474, the N-type body contact region 476, and/or the gate electrode 464 to reduce contact resistance. At block S58, an interlayer dielectric (ILD) layer 196 is formed above the semiconductor substrate 110, and a plurality of contacts 242, 244, and 246 are formed in the ILD layer 196 to contact the respective metal alloy layers 220 (i.e., silicide layers 220). For example, the contact 242 is connected to the gate structure 460, the contact 244 is connected to the N-type body contact region 476 and the P-type source and drain regions 472, the contact 246 is connected to the P-type source/drain regions 474 (i.e., the drain region of the semiconductor device 400).

FIGS. 25-28 illustrate exemplary cross sectional views of various stages for manufacturing a semiconductor device 600 according to some embodiments of the present disclosure. It is understood that additional operations can be provided before, during, and after processes shown by FIGS. 25-28, and some of the operations described below can be replaced or eliminated, for additional embodiments of the method. The order of the operations/processes may be interchangeable. The same or similar configurations, materials, processes and/or operation as described with FIGS. 2-20 may be employed in the following embodiments, and the detailed explanation may be omitted.

Figure 25:
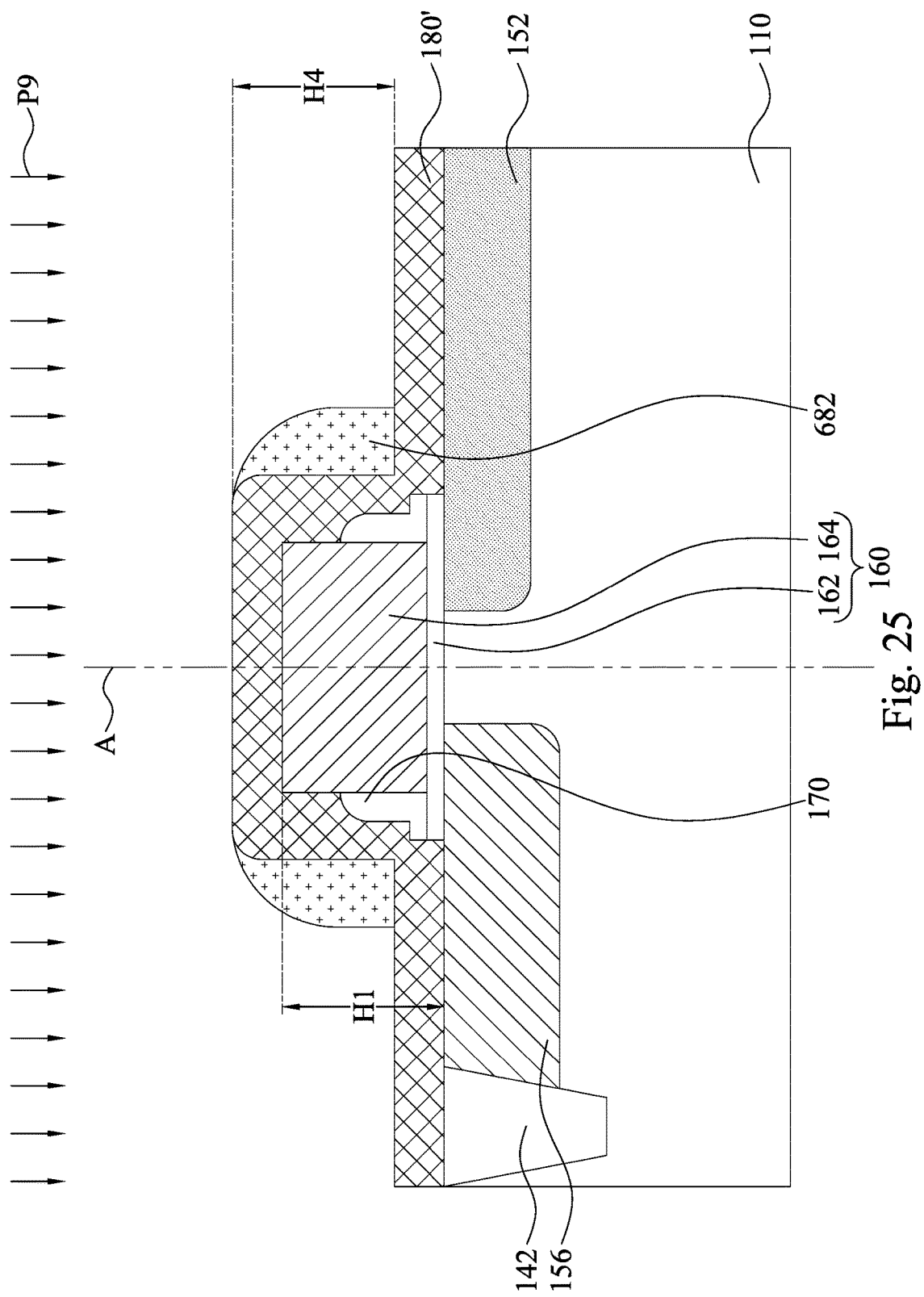
FIGS. 25 to 28 illustrate a method for manufacturing a semiconductor device in different stages in accordance with some embodiments.

After the structure as shown in FIG. 11 is formed, an anisotropic etching process P9 is performed to remove the horizontal portions of the third spacer layer 182'. The resulting structure is shown in FIG. 25. The etching operation P9 etches the third spacer layer 182' at a faster etch rate than it etches the second spacer layer 180'. For example, a ratio of the etch rate of the third spacer layer 182' to the etch rate of the second spacer layer 180' may be greater than about 2. If the ratio of the etch rate of the etching operation P9 to the third spacer layer 182' to the etch rate of the etching operation P9 to the second spacer layer 180' is less than about 2, the etching operation P9 would significantly consume the second spacer layer 180', and thus the second spacer layer 180', polysilicon gate 164, first gate spacer 170, and semiconductor substrate 110 may be damaged, and thus the yield may reduce. In some embodiments, a ratio of the etch rate of the third spacer layer 182' to the etch rate of the second spacer layer 180' may be greater than about 10. In some embodiments, the etching process is performed using an isotropic etching process. In some embodiments, the third spacer layer 182' is etched using, for example, phosphoric acid ($H_3PO_4$).

As illustrated in FIG. 25, the remaining vertical portions of third spacer layer 182' serve as third gate spacers 682. The third gate spacers 682 have a height H4 measured from the top surface of the second spacer layer 180'. In some embodiments, the height H4 of the third gate spacers 682 may be substantially the same as or comparable to the height H1 of the gate electrode 164. The height H4 of the third gate spacers 682 depends on process conditions of the anisotropic etching process P9 (e.g., etching time duration and/or the like). For example, the etching time duration of the etching process P9 can be controlled such that the resulting third gate spacers 682 has a topmost position substantially level with a topmost position of the second spacer layer 180'.

Figure 26:
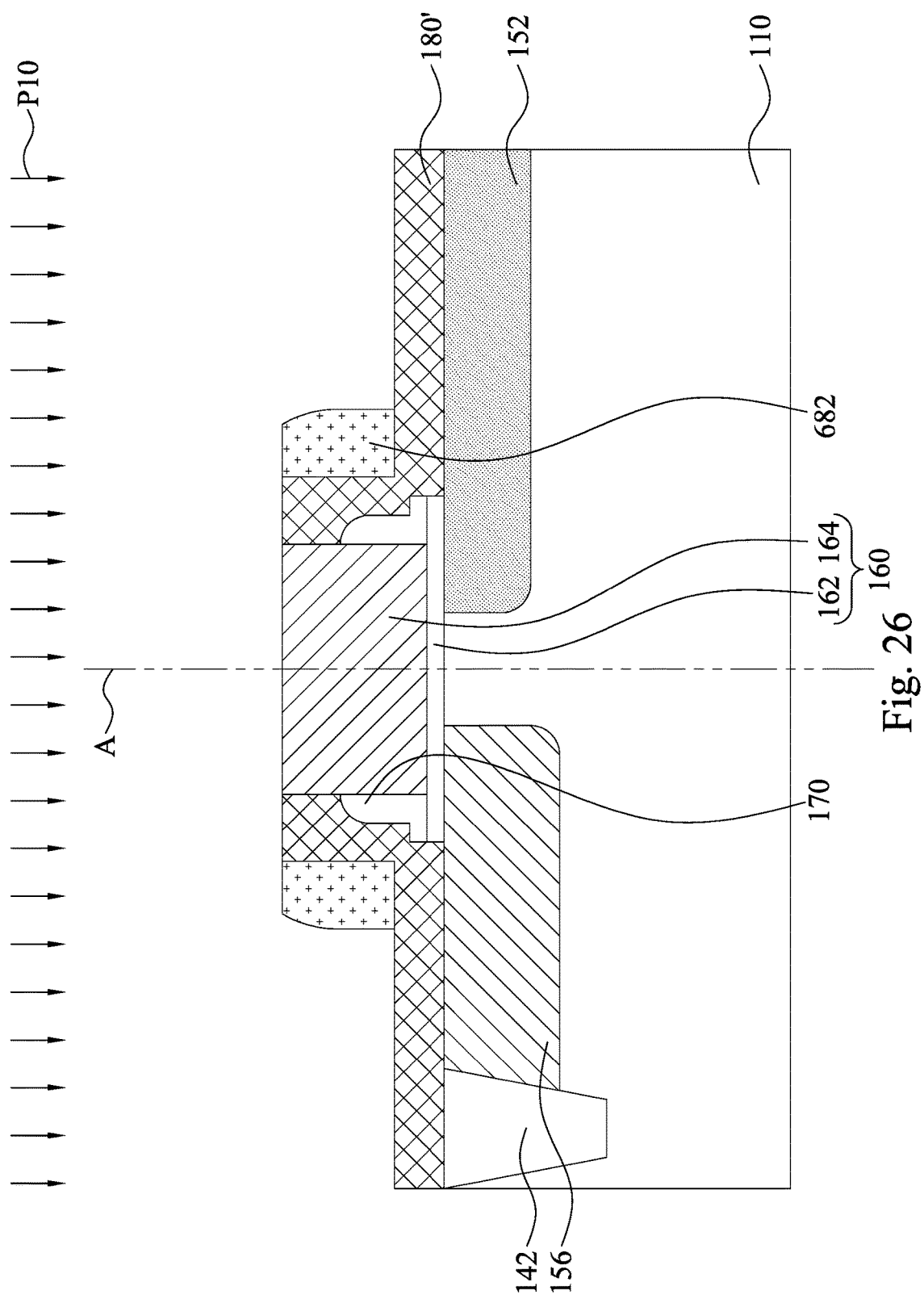

Afterwards, as illustrated in FIG. 26, a planarization process P10 such as chemical mechanical polish (CMP) is performed to remove the excess third gate spacer 682 and the second spacer layer 180' over the gate electrode 164 such that a top surface of the gate electrode 164 is exposed. In some embodiments, the planarization process stops when the gate electrode 164 is exposed, and the gate electrode 164 may act as the etch stop layer in the planarization. Thus, the second spacer layers 180' may not overlap with a top surface of the gate electrode 164. In some embodiments, after the planarization process, a top surface of the second spacer layers 180' may be level with the top surface of the gate electrode 164.

Figure 27:
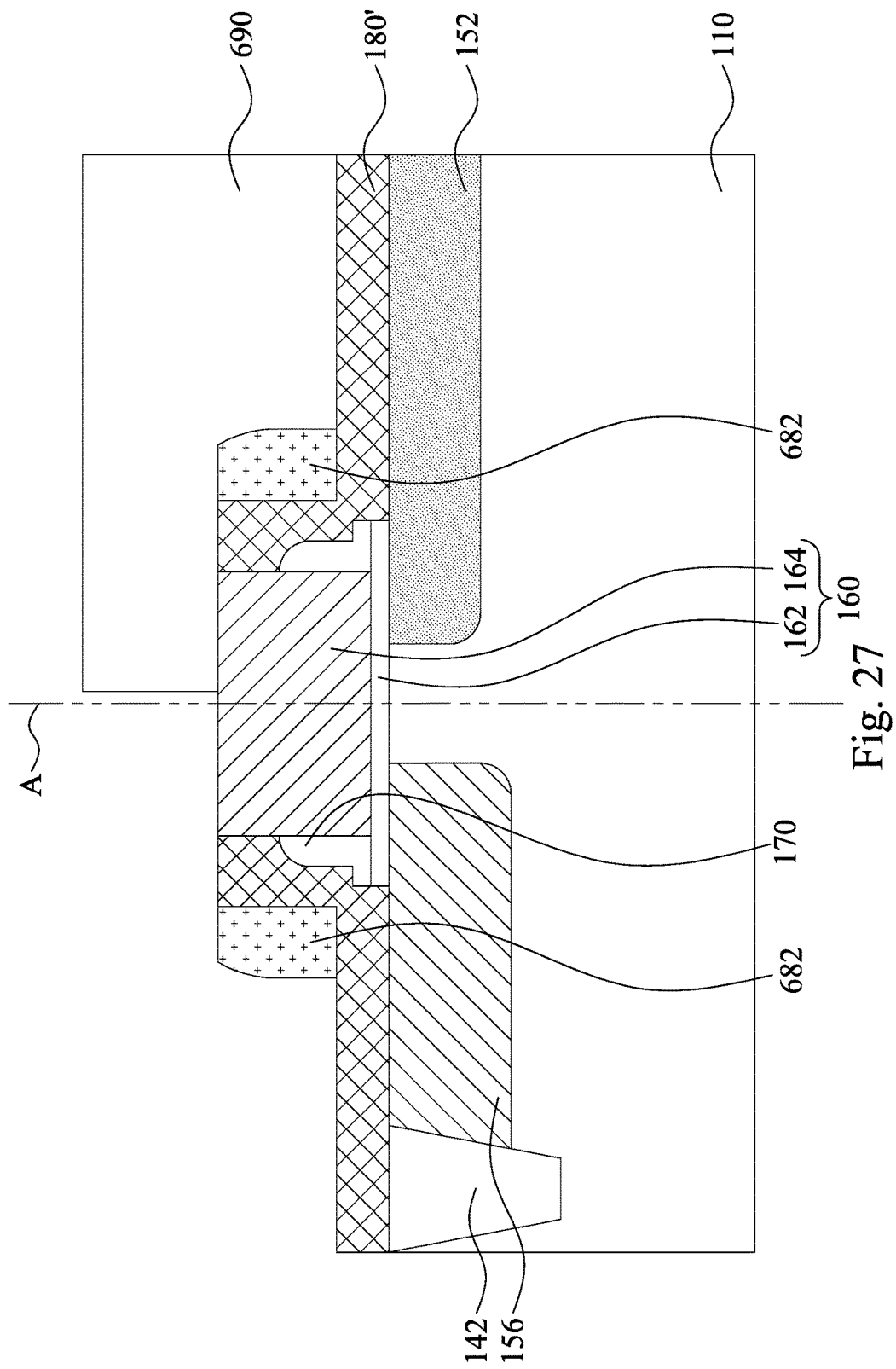

It is noted that the sequence of the etching process P9 shown in FIG. 26 and the planarization process P10 shown in FIG. 27 mentioned above is an example, and is not used to limit the present disclosure. In some other embodiments, the planarization process P10 can be performed before the etching process P9.

Afterwards, as illustrated in FIG. 27, a mask layer 690 is formed over the semiconductor substrate 110 and then patterned to form separated mask portions to cover a portion of the gate structure 160, the first gate spacer 170, the third gate spacer 682, and the second spacer layer 180' on a right side of the symmetrical axis A of the gate structure 160, and exposes another portion of the gate structure 160, the first gate spacer 170, and third gate spacer 682, and the second spacer layer 180' on a left side of the symmetrical axis A of the gate structure 160.

As illustrated in FIG. 27, the mask layer 690 is in contact with a top surface of the gate structure 160, because the top surface of the gate structure 160 is free from coverage by the second spacer layer 180' due to the CMP process P10 as illustrated in FIG. 27. In some embodiments, the mask layer 690 may be formed by a photolithography patterning processes. The photolithography patterning processes may include photoresist coating (e.g., spin-on coating), soft baking, mask aligning, exposure, post-exposure baking, developing the photoresist, rinsing, drying (e.g., hard baking), and/or other applicable processes.

Figure 28:
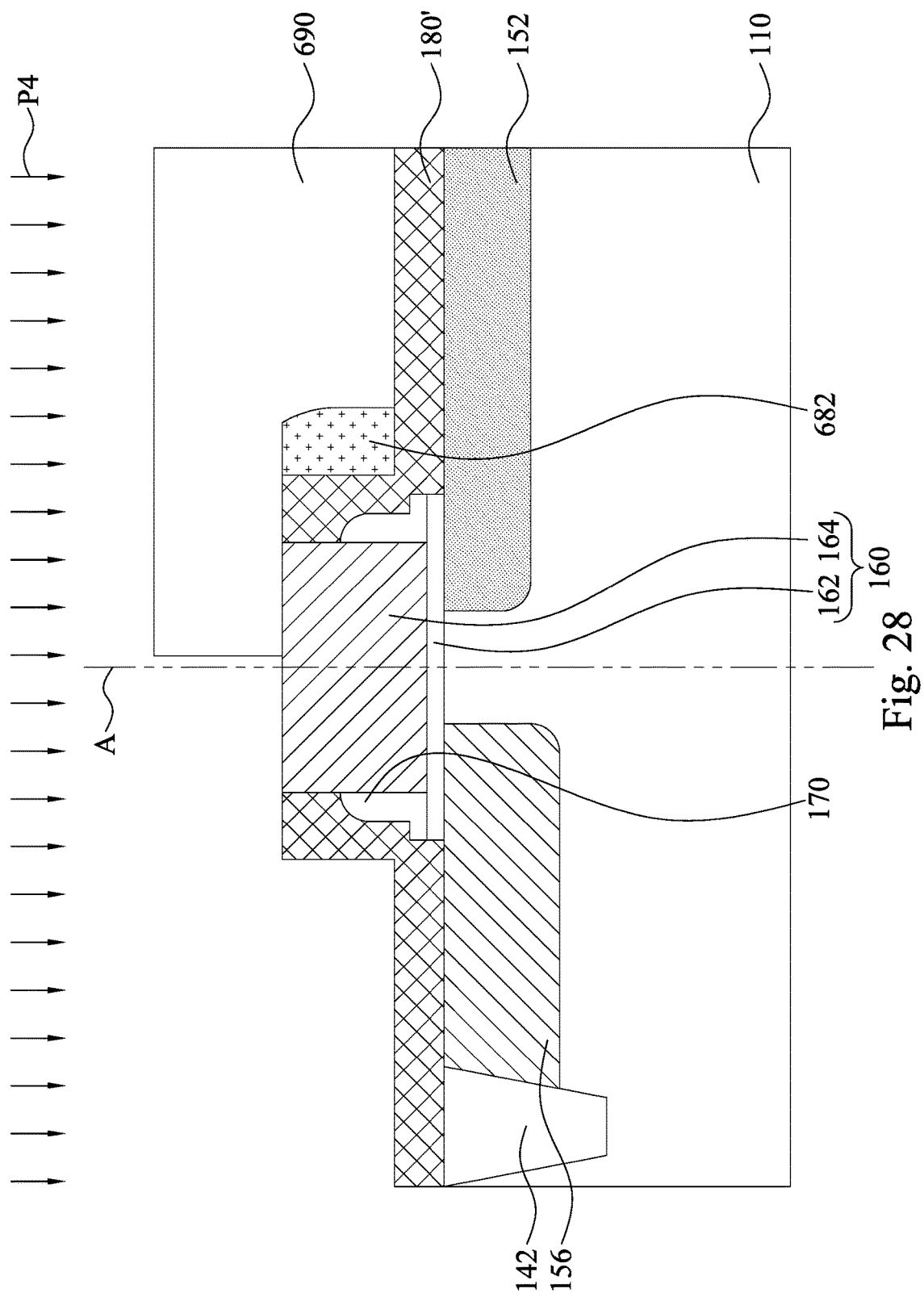

Thereafter, as illustrated in FIG. 28, an etching process P4 is performed to remove the third gate spacer 682 exposed by the mask layer 690. The etching process P4 is a selective etching process that uses an etchant etching the nitride spacer 682 at a faster etch rate than it etches the oxide spacer layer 180'. In this way, the oxide spacer layer 180' remains substantially intact after removing the nitride spacer 682 from the left side of the symmetrical axis A of the gate structure 160. For example, the etchant used in the etching process P4 includes phosphoric acid ($H_3PO_4$).

Afterwards, the process steps as illustrated in FIGS. 15-20 continue to complete fabrication of the LDMOS transistor.

According to the aforementioned embodiments, it can be seen that the present disclosure offers advantages in fabricating semiconductor devices. It is understood, however, that other embodiments may offer additional advantages, and not all advantages are necessarily disclosed herein. An advantage is that field oxide (FOX) can be omitted in the NDD/PDD region of the LDMOS transistor, which in turn will reduce the device size and the specific on-state resistance (Rsp). Another advantage is that the un-doped and/or un-silicide regions in the polysilicon gate can be reduced. Yet another advantage is that the drift region length can be precisely controlled by the oxide spacer thickness and the nitride spacer thickness, which in turn will be aid in scaling down the drift region length. Moreover, trade-off among drain-source breakdown voltage (BVDSS), specific on-state resistance (Rsp), and switch speed of the LDMOS transistor can be improved, and excellent figure of merit (FOM) can be achieved.

In some embodiments, a semiconductor device includes a gate structure, a double diffused region, a source region, a drain region, a first gate spacer, and a second gate spacer. The gate structure is over a semiconductor substrate. The double diffused region is in the semiconductor substrate and laterally extends past a first side of gate structure. The source region is in the semiconductor substrate and is adjacent a second side of the gate structure opposite the first side. The drain region is in the double diffused region in the semiconductor substrate and is of a same conductivity type as the double diffused region. The first gate spacer is on the first side of the gate structure. The second gate spacer extends upwardly from the double diffused region along an outermost sidewall of the first gate spacer and terminates prior to reaching a top surface of the gate structure. The second gate spacer has an outermost end surface substantially aligned with a boundary of the drain region.

In some embodiments, a semiconductor device includes a semiconductor substrate, a double diffused region, a gate structure, a drain region, a first gate spacer, a drain silicide layer, and a second gate spacer. The double diffused region is in the semiconductor substrate. The gate structure overlaps at least a portion of the double diffused region. The drain region is in the double diffused region and is of a same conductivity type as the double diffused region. The first gate spacer is alongside the gate structure and over the double diffused region. The drain silicide layer laterally extends from an outermost end surface of the first gate spacer along a top surface of the drain region. The second gate spacer is over the first gate spacer and has an outermost end substantially aligned with a boundary of the drain region.

In some embodiments, a method for manufacturing a semiconductor device includes forming a body region of a first conductivity type and a doped region of a second conductivity type in a semiconductor substrate; forming a gate structure over a portion of the body region and a portion of the doped region, and first gate spacers respectively on first and second sides of the gate structure; depositing, in sequence, a second spacer layer and a third spacer layer over the gate structure; patterning the third spacer layer into third gate spacers respectively on the first and second sides of the gate structure; removing a first one of the third gate spacers from the first side of the gate structure, while leaving a second one of the third gate spacers on the second side of the gate structure; patterning the second spacer layer into a second gate spacer by using the second one of the third gate spacers as an etching mask; and after patterning the second spacer layer, forming a source region of the second conductivity type in the body region and a drain region of the second conductivity type in the doped region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a gate structure over a semiconductor substrate;
a double diffused region in the semiconductor substrate and laterally extending past a first side of the gate structure;
a source region in the semiconductor substrate and adjacent a second side of the gate structure opposite the first side;
a drain region in the double diffused region in the semiconductor substrate and of a same conductivity type as the double diffused region;
a first gate spacer on the first side of the gate structure; and
a second gate spacer extending upwardly from the double diffused region along an outermost sidewall of the first gate spacer, and terminating prior to reaching a top surface of the gate structure, wherein the second gate spacer has an outermost end surface substantially aligned with a boundary of the drain region, wherein the first gate spacer is in contact with a lower region of the first side of the gate structure, and the second gate spacer is in contact with an upper region of the first side of the gate structure.

2. The semiconductor device of claim 1, further comprising:
a silicide layer over the drain region and in contact with the outermost end surface of the second gate spacer.

3. The semiconductor device of claim 1, further comprising:
a silicide layer in contact with an entirety of the top surface of the gate structure.

4. The semiconductor device of claim 3, wherein the second gate spacer is spaced apart from the silicide layer on the gate structure.

5. The semiconductor device of claim 1, further comprising:
a third gate spacer over the second gate spacer.

6. The semiconductor device of claim 5, wherein the third gate spacer is formed of silicon nitride, and the second gate spacer is formed of silicon oxide.

7. The semiconductor device of claim 1, further comprising:
a fourth gate spacer on the second side of the gate structure, wherein the first gate spacer and the fourth gate spacer are substantially symmetric with respect to the gate structure, and the fourth gate spacer has an outermost end surface substantially aligned with a boundary of the source region.

8. The semiconductor device of claim 7, further comprising:
an interlayer dielectric (ILD) layer in contact with the fourth gate spacer, the ILD layer being spaced apart from the first gate spacer at least in part by the second gate spacer.

9. The semiconductor device of claim 7, wherein the gate structure has a gate dielectric layer having a first end surface set back from the outermost end surface of the fourth gate spacer.

10. The semiconductor device of claim 9, wherein the gate dielectric layer has a second end surface in contact with the second gate spacer.

11. The semiconductor device of claim 7, further comprising:
a silicide layer over the source region and having an end surface in contact with the outermost end surface of the fourth gate spacer.

12. A semiconductor device, comprising:
a semiconductor substrate;
a double diffused region in the semiconductor substrate;
a gate structure overlapping at least a portion of the double diffused region;
a drain region in the double diffused region and of a same conductivity type as the double diffused region;
a first gate spacer alongside the gate structure and over the double diffused region;
a drain silicide layer laterally extending from an outermost end surface of the first gate spacer along a top surface of the drain region; and
a second gate spacer over the first gate spacer and having an outermost end substantially aligned with a boundary of the drain region, wherein the drain silicide layer is in contact with the first gate spacer and spaced apart from the second gate spacer.

13. The semiconductor device of claim 12, wherein the first gate spacer is formed of silicon oxide, and the second gate spacer is formed of silicon nitride.

14. The semiconductor device of claim 12, further comprising:
a third gate spacer between the gate structure and the first gate spacer.

15. The semiconductor device of claim 14, wherein the third gate spacer is formed of a same material as the second gate spacer.

16. The semiconductor device of claim 12, wherein a topmost position of the first gate spacer is lower than a topmost position of the gate structure.

17. The semiconductor device of claim 12, wherein a topmost position of the second gate spacer is lower than a topmost position of the gate structure.

18. A semiconductor device, comprising:
- a semiconductor substrate;
- a gate structure over the semiconductor substrate;
- a doped region in the semiconductor substrate and in the vicinity of a first side of the gate structure;
- a first source/drain region in the vicinity of a second side of the gate structure opposite the first side;
- a second source/drain region in the doped region and of a same conductivity type as the doped region;
- a multi-layer gate spacer laterally spacing the second source/drain region apart from the gate structure, the multi-layer gate spacer comprising a first spacer layer and a second spacer layer over the first spacer layer, and both the first and second spacer layers are in contact with a sidewall of the gate structure; and
- a gate silicide region on the gate structure and having a top surface higher than a topmost position of the multi-layer gate spacer.

19. The semiconductor device of claim 18, further comprising:
- a gate spacer laterally spacing the first source/drain region apart from the gate structure, the multi-layer gate spacer having more layers than the gate spacer.

20. The semiconductor device of claim 18, further comprising:
- a body contact region abutting the first source/drain region, the body contact region being of a different conductivity type than the first source/drain region.

* * * * *